US006605955B1

(12) United States Patent
Costello et al.

(10) Patent No.: US 6,605,955 B1
(45) Date of Patent: *Aug. 12, 2003

(54) TEMPERATURE CONTROLLED WAFER CHUCK SYSTEM WITH LOW THERMAL RESISTANCE

(75) Inventors: Simon Costello, Los Angeles, CA (US); Tuyen Paul Pham, Sunland, CA (US)

(73) Assignee: Trio-Tech International, Van Nuys, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/491,275

(22) Filed: Jan. 26, 2000

Related U.S. Application Data

(63) Continuation-in-part of application No. 09/238,009, filed on Jan. 26, 1999.

(51) Int. Cl.$^7$ .............................................. G01R 31/02
(52) U.S. Cl. .................................... 324/760; 324/158.1
(58) Field of Search ............................. 324/760, 158.1; 165/80.1, 80.2, 80.3; 361/145, 274.3

(56) References Cited

U.S. PATENT DOCUMENTS

| | | | | |
|---|---|---|---|---|
| 4,791,364 A | * | 12/1988 | Kufis et al. ............... | 324/158.1 |
| 5,033,538 A | * | 7/1991 | Wagner et al. ............. | 165/80.1 |
| 5,034,688 A | * | 7/1991 | Moulene et al. .......... | 324/158.1 |
| 5,578,532 A | * | 11/1996 | van de Ven et al. ....... | 29/25.01 |
| 5,595,241 A | * | 1/1997 | Jelinek ...................... | 165/80.1 |
| 5,610,529 A | * | 3/1997 | Schwindt .................... | 324/760 |
| 5,834,946 A | * | 11/1998 | Albrow et al. ............... | 324/760 |
| 6,072,325 A | * | 6/2000 | Sano ........................... | 324/758 |
| 6,084,215 A | * | 7/2000 | Furuya et al. ............... | 324/760 |

* cited by examiner

Primary Examiner—Kamand Cuneo
Assistant Examiner—Jimmy Nguyen
(74) Attorney, Agent, or Firm—McDermott, Will & Emery

(57) ABSTRACT

A temperature-controlled semiconductor wafer chuck system, the chuck being configured for mounting on a prober stage of a wafer probe test station. The chuck having a top surface and a bottom surface including a heat sink configuration for removal of thermal energy from the chuck. A primary heater configured to add heat to the chuck is adjacent the top surface of the chuck. A secondary heater is adjacent to the bottom of the chuck, whereby the temperature of the top surface of the chuck and the bottom of the chuck can be independently controlled. The chuck may include a plurality of layers above the heat sink which may be connected to accommodate differential expansion and contraction, thereby minimizing distortion of the chuck due to thermal effects. The heat sink and associated layers are integrally connected and are configured to stiffen the chuck to resist deformation due to forces applied to the chuck by probe pins. Still further, the chuck has cooling channels closer to the top surface than the heater and is disclosed to reduce the thermal resistance of the chuck. Furthermore, a chuck with a heater having double walled construction is disclosed whereby the inner wall is grounded and insulated from the outer wall to shield the chuck from voltage and electrical noise from the heater.

Furthermore, a chuck with a prober adapter with a thermal insulator, secondary heater and cooling channels to offset the heat generated by the chuck and maintain the prober adapter at some preferred operating temperature.

16 Claims, 16 Drawing Sheets

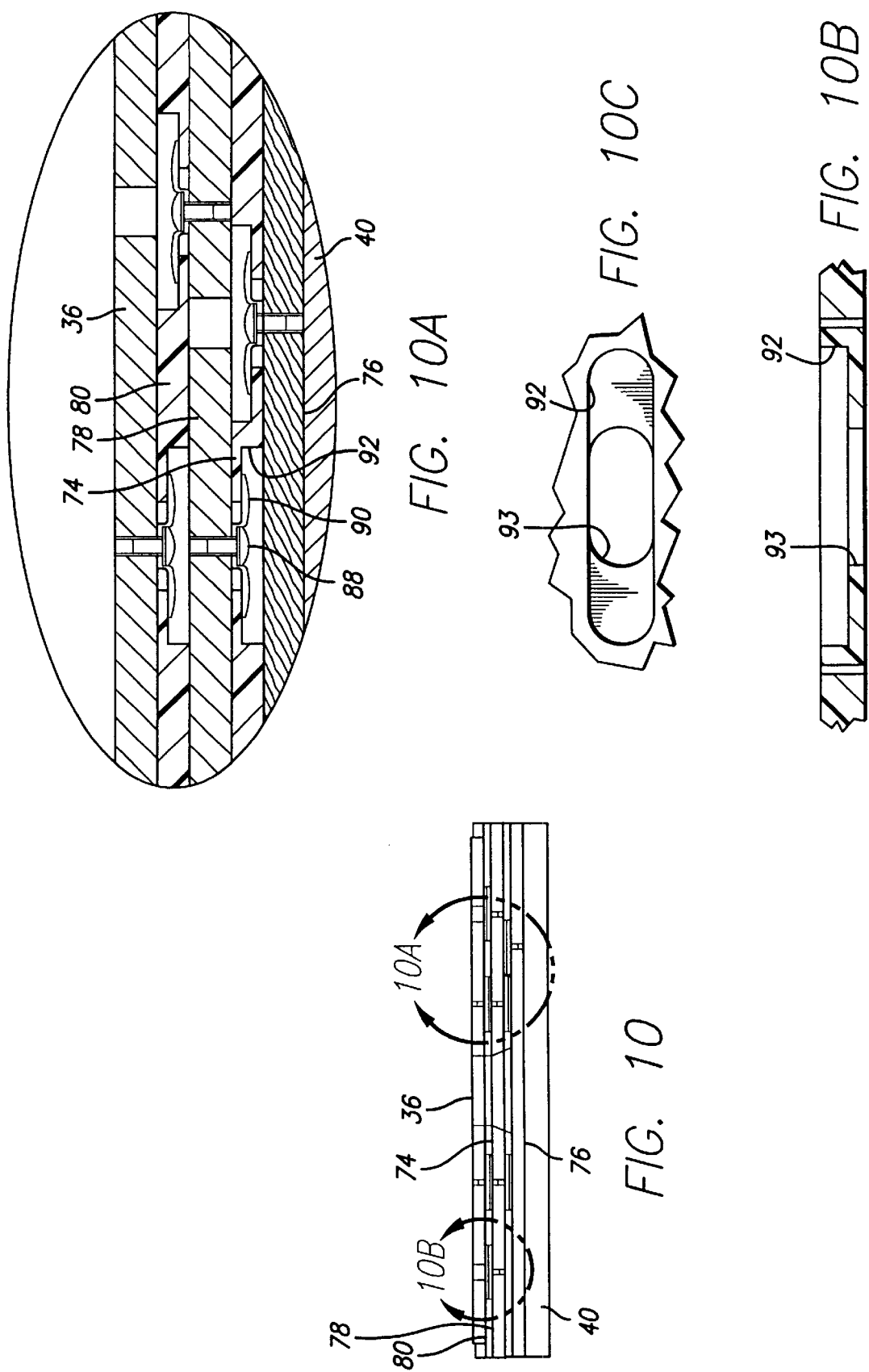

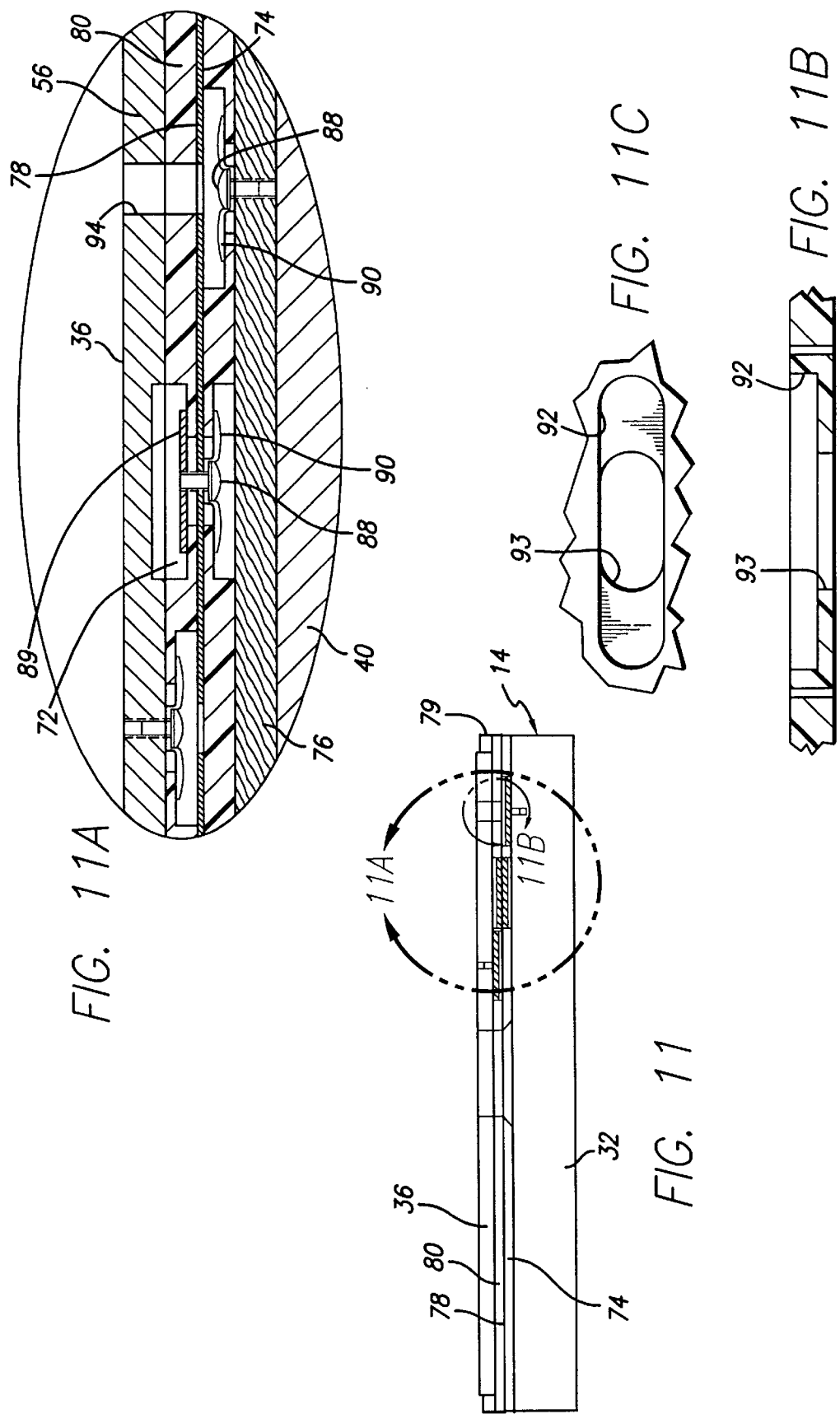

TEMPERATURE CONTROLLED WAFER CHUCK SYSTEM WITH LOW THERMAL RESISTANCE

CROSS-REFERENCES TO RELATED APPLICATION

This application is a continuation-in-part of U.S. patent application Ser. No. 09/238,009, filed Jan. 26, 1999, which is hereby incorporated by reference into this application.

BACKGROUND OF THE INVENTION

1. Field of the Invention

The invention relates generally to a semiconductor wafer platform, or chuck, used to support, and by means of applied vacuum, hold, a wafer for testing in a prober station. More specifically, the invention relates to a temperature-controlled semiconductor wafer chuck which directly heats or cools the semiconductor wafer for, and during, manufacture, testing, characterization, and failure analysis of semiconductor wafers and other components at hot and cold temperatures.

2. Description of the Related Art

In the conventional manufacture of semiconductor devices, semiconductor wafers are first produced. Each semiconductor wafer can contain many individual electronic devices or electronic circuits, which are known as dies. Each die is electrically tested by connecting it to suitable test equipment. Probe pins, which are connected to the test equipment, are brought into contact with the die to be tested. This generally occurs at a prober station, which conventionally includes a prober stage supporting a wafer chuck, which in turn supports the wafer. The prober station in production applications is usually an automated testing apparatus, and such stations are well known. Alternatively the prober station can be such as will facilitate manual testing by a human operator; and in the latter case also includes a means for magnifying the wafer for observation by testing personnel, which can be employed in confirming accurate probe placement. In either case a conventional prober station also includes means for micropositioning of the prober stage, and accordingly the chuck and a wafer supported thereon, with respect to test probes etc.

It is often required to control the temperature of the die during testing, and for this purpose the semiconductor wafer chuck can be a temperature-controlled chuck. In many cases such chucks are required to be able to both heat and cool the wafer. Many types of temperature-controlled chucks are known and are widely commercially available. The simplest form consists of a chuck incorporating a heater element; and the heater heats the chuck. This design relies on natural convection to cool the chuck. This method of cooling can be too slow for many commercial production test requirements.

Temperature-controlled chucks that incorporate heaters and heat sinks are also available. Heaters can take several forms, such as plate heaters, coil heaters, mica heaters, thin film heaters, peltier elements or heater rods incorporated into the chuck. Another method involves casting the heater rods into an element of the chuck structure. Cooling is provided by a heat sink that is cooled by a recirculating fluid, or in other designs by passing a fluid through the chuck without recirculating it. The fluid can be a liquid or a gas, usually air in the latter case. The liquid or air can be chilled for greater cooling effect in passing through the chuck, and can be recirculated for greater efficiency. A chuck cooled by means of a fluid chilled to a temperature below ambient temperature enables wafer probing at temperatures below ambient.

In general, current conventional heat-sink designs incorporate simple cooling channels cross-drilled and capped in the chuck base.

In order to increase their performance, the density and complexity of semiconductor devices is increasing. Feature sizes, i.e. line widths, pad areas etc. are becoming increasingly smaller. This has led to certain new requirements for temperature-controlled chucks.

As an example, the number of probe pins to be connected to each individual die is increasing. Each of these probe pins can exert a pressure of up to several ounces on each of the test pads. With a high number of probe pins, which can be several hundred over a 1 square inch area or less, the supporting chuck is put under a relatively high load due to the applied force. This force can cause the chuck to deform. Bending and displacement of the chuck, even by relatively minute amounts, can, in turn, result in the test probe pins moving off the test pads.

A solid chuck, for example, not one that is temperature controlled, can provide the structural strength required for this probing. However, insufficient rigidity can be a problem for current temperature-controlled chuck designs. Conventionally, incorporating heating and cooling means reduces the structural strength of the chuck. Current temperature-controlled chuck design is limited to less than optimal performance in providing both the thermal performance and mechanical stability required for these high probe force applications. What is needed is a temperature-controlled chuck that has good thermal performance and also a high degree of structural strength in resisting loads induced by probe pins.

For accurate positioning of the probe pins on each die, the wafer chuck must remain mechanically stable. In addition to deformation resulting from applied load forces, heating and cooling of the temperature-controlled chuck can lead to changes in the height, leveling and planarity of the top surface of the chuck, which can in turn require re-calibration of the probe station, repositioning of probe pins, and re-focusing of microscopes. Current temperature-controlled chuck designs provide less than desirable mechanical stability over the needed temperature ranges. What is needed is a temperature-controlled chuck design that will minimize changes in height, leveling and planarity over the temperature range of the chuck during testing.

As mentioned, wafer chucks are usually mounted in probe stations that, amongst other functions, position the wafer chuck such that the semiconductor die is brought into contact with the probe pins. The chuck is mounted on a prober stage that can be moved, manually or automatically, with extreme accuracy. These prober stages in particular can be sensitive to changes in temperature. Current temperature-controlled chucks provide various means of thermal insulation between the chuck and the prober stage. Over time however, thermal energy can be conducted to or from the prober stage. In cases where the temperature deviates significantly from ambient this can cause inaccuracies of positioning or damage to the prober station or prober stage. What is needed is a system that mitigates or eliminates this and the other problems discussed above.

SUMMARY OF THE INVENTION

In a first aspect of the invention, a temperature-controlled semiconductor wafer chuck system is provided which incorporates a wafer chuck having a top surface and a bottom surface, the chuck being configured for mounting on a prober stage of a wafer probe station, the system comprising a heat sink incorporating a cooler, which further comprises a fluid conduit which distributes a coolant fluid substantially uniformly through the heat sink for removing thermal energy therefrom. The heat sink further comprises pillars disposed in the fluid conduit and configured to transfer force across the fluid conduit, whereby forces applied to the top surface of the chuck are transferred through the heat sink incorporated in the chuck to the prober stage, without substantial deformation of the chuck.

In another aspect of the invention it provides a temperature-controlled semiconductor wafer chuck system including a chuck further including a chuck top plate comprising a top surface of the chuck, a chuck bottom plate comprising a bottom surface of the chuck, a first heater disposed between the heat sink and the top surface of the chuck and a second heater disposed between the heat sink and the bottom surface of the chuck. With this configuration the temperature of the top surface of the chuck and the bottom surface of the chuck can be independently controlled. In a more detailed aspect the top and bottom surfaces can be independently maintained at different desired temperatures. This is done by independently controlling the first and second heaters as required to independently add heat to the chuck adjacent the top and bottom surfaces respectively, and removing heat through the heat sink as required by action of the cooler.

In another aspect of the invention, the heat sink further comprises a cooling conduit configured for guiding a heat absorbing fluid through the heat sink. The heat sink further comprises a multiplicity of pillars extending through the cooling conduit dividing it into a multiplicity of interconnected channels, the pillars being sized and placed to transmit force applied normal to the top surface of the chuck through the heat sink to the bottom surface of the of the chuck. In a more detailed aspect the heat sink can comprise at least two elements permanently joined to form an integral structure, at least one of the elements having the interconnected channels formed in one side and the other element closing the channels to form a fluid tight cooling conduit within a relatively rigid structure. Due to its configuration the heat sink substantially uniformly resists compressive loads due to forces applied in a direction perpendicular to the top surface of the chuck with minimum deformation, and also resists bending of the chuck when probe loads are applied nearer to the outer edges of the chuck in areas not directly supported underneath by a prober stage. The placement of the pillars can be such that it forms a uniform pattern.

In further more detailed aspects, the configuration of the cooling channel can be such that cooling fluid enters and exits the chuck at locations adjacent one another, the path of fluid flow being essentially U-shaped. The fluid channel can be formed by a machining or a casting process in fabrication of the heat sink. The majority of pillars can incorporate corners, tending to induce turbulent flow of the cooling fluid rather than laminar flow, improving efficiency.

Also in a more detailed aspect, the first or primary heater and the second or secondary heater can both be electrical resistance coil type heaters. They can employ a direct current power source.

In additional more detailed aspects, the temperature-controlled wafer chuck system can further comprise a first temperature sensor configured to monitor temperature at the top surface of the chuck, and a second temperature sensor configured to monitor the temperature adjacent the bottom surface of the chuck, the temperature sensors each generating a signal which is correlated with the temperature at the location of the sensor. Multiple sensors, forming an array, can be used to take into consideration local hot and cold spots on the top and bottom of the chuck in controlling temperature. The system can further comprise a controller configured to receive signals from the first and second temperature sensors or sensor arrays and control the first and second heaters and the cooler so as to control the temperature at the top and bottom surfaces of the chuck. A user interface can be employed, enabling selection of desired temperatures and communication of sensed temperatures at the top and bottom surfaces of the chuck. When the heaters are electrical, the controller can be programmed so that it raises or lowers the temperature at the top and bottom surfaces by increasing or decreasing the power supplied to a heaters gradually, rather than simply turning them on and off. This can be done so as to avoid electrical noise attendant sudden changes in current passing through the heater(s).

In a further more detailed aspect, the system can be configured so that the controller maintains the temperature of the bottom surface of the chuck at substantially the same temperature as the prober stage of a probing station during thermal test probing of a wafer, to minimize thermal effects on the prober stage during such testing.

In another more detailed aspect, the temperature-controlled wafer chuck of the system can further comprise an isolation layer disposed between the heater atop the heat sink and the top plate, said isolation layer being formed of an electrically non-conductive material. The temperature-controlled wafer chuck system can further include an electrically conductive guard layer disposed on top of the isolation layer, and a further isolation layer between the guard layer and the chuck top. With this configuration the guard layer and chuck top can be brought to the same electrical potential to further reduce current leakage through the chuck and further electrically isolate a wafer supported on top of the chuck during testing from electrical noise generated by heaters and prober mechanisms.

In another aspect of the invention the temperature-controlled wafer chuck can further comprise a differential expansion and contraction accommodation assembly, whereby distortion of the chuck due to differences in expansion and contraction between layer elements such as the top plate and the isolation layer and the heat sink and heater elements is minimized. The expansion and contraction accommodation assembly further can comprise over-sized and/or slotted holes in the elements and bolts and washers allowing relative movement between adjacent elements and minimizing distortion of the elements.

In the case of a chuck configured to also incorporate a conductive guard layer and further isolation layer, facilitating trivial or guarded testing of semiconductor wafer dies, increased potential for distortion exists and such a chuck can also further comprise a differential expansion and contraction accommodation assembly incorporated in a mechanical connection between the additional layer elements, whereby distortion of the chuck due to differential expansion and contraction of the layer elements is minimized.

Additionally, a chuck configured in accordance with principles of the invention can also be configured so that a vacuum can be created between the layer elements to further hold them in place in close proximity to each other while allowing relative movement due to differential thermal expansion.

As will be appreciated, a temperature-controlled chuck made in accordance with principles of the invention has good thermal performance, and also a high degree of structural strength in resisting loads induced by prober pins. The invention incorporates new design and assembly features that help minimize changes in height, flatness and planarity over the temperature range of the chuck. The chuck incorporates a method and apparatus for actively controlling the temperature of the base of the chuck to eliminate the problem of thermal effects on the prober stage, for example by matching the temperature of the bottom of the chuck to the temperature of the prober stage, which usually is the same as an ambient environmental temperature.

There are other objective to the present invention. For example, one such objective is to lower the thermal resistance of the chuck. Yet another objective is to minimize the number of parts in manufacturing the chuck, to lower the cost in producing the chuck. Still another objective of is to minimize electrical noise on the chuck, without grounding the chuck.

Other features and advantages will be apparent with reference to the appended drawings taken together with the following detailed description. These are given by way of example, and not by way of limitation of the scope of the invention.

BRIEF DESCRIPTION OF THE DRAWINGS

FIG. 10 is a cross-sectional view of a portion of the wafer chuck shown in FIG. 6 showing further detail regarding interconnection of the layers;

FIG. 10A is a cross-sectional view of a portion of the wafer chuck shown in FIG. 10, showing further detail regarding interconnection of the layers;

FIG. 10B is a cross-sectional view of a portion of an isolation layer of the chuck illustrated in FIG. 10 showing further detail of the interconnection of the layers;

FIG. 10C is a top view in breakaway of a portion of the isolation layer shown in FIG. 10B showing an allowance for thermal expansion and contraction in the chuck assembly;

FIG. 11 is a cross-sectional view of a portion of the wafer chuck shown in FIG. 6 showing further detail regarding interconnection of the layers in another embodiment;

FIG. 11A is a cross-sectional view of a portion of the wafer chuck shown in FIG. 11, showing further detail regarding interconnection of the layers;

FIG. 11B is a cross-sectional view of a portion of an isolation layer of the chuck illustrated in FIG. 11 showing further detail of the interconnection of the layers;

FIG. 11C is a top view in breakaway of a portion of the isolation layer shown in FIG. 11B showing an allowance for thermal expansion and contraction in the chuck assembly;

DETAILED DESCRIPTION OF THE PREFERRED EMBODIMENT(S)

Figure 1:
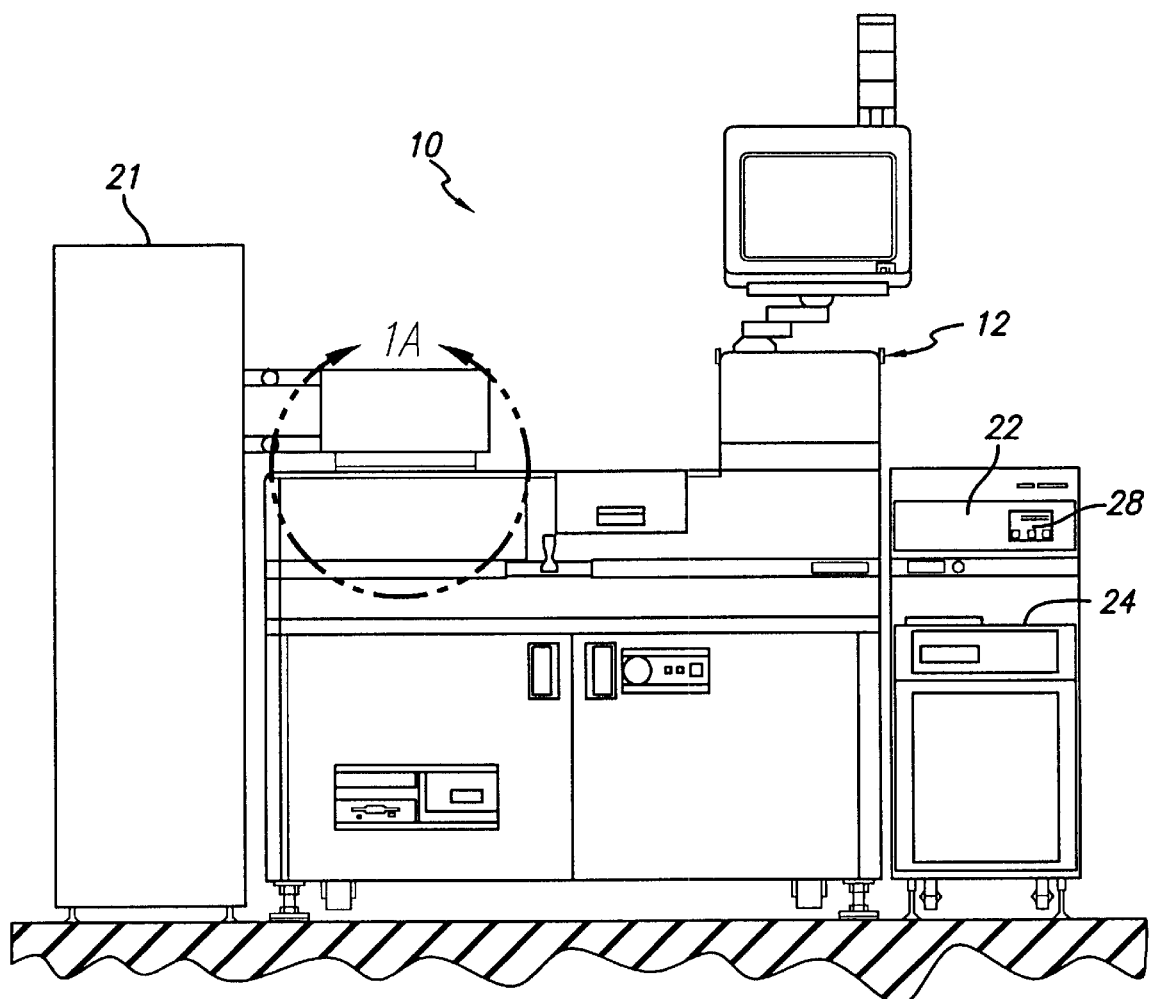
FIG. 1 is a front elevation view of a temperature-controlled semiconductor wafer chuck system in accordance with principles of the invention incorporated in a test station for testing of wafer dies, illustrating the environment of the invention.
Figure 1A:
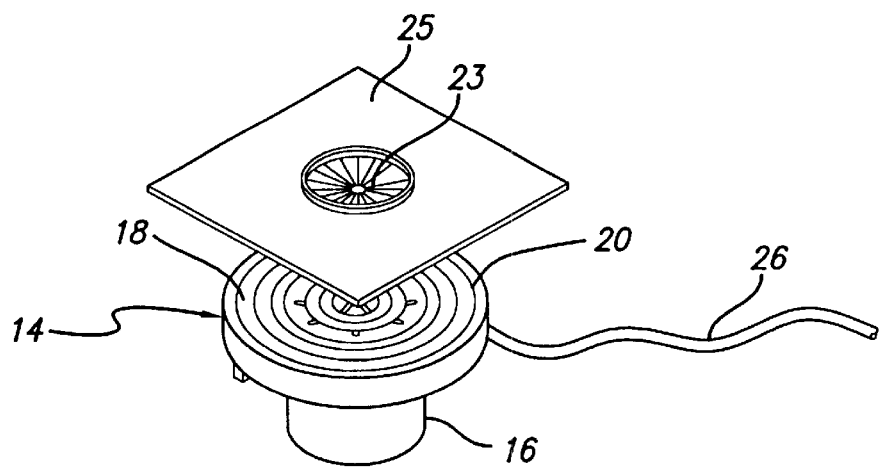
FIG. 1A is a perspective view of a portion of the semiconductor wafer test station shown in FIG. 1, further illustrating the temperature-controlled semiconductor wafer chuck system in accordance with principles of the invention, showing a temperature controlled semiconductor wafer chuck mounted on a prober stage of the test station for testing of wafer dies, further illustrating the environment of the invention.

With reference to FIGS. 1 and 1A of the drawings, a temperature-controlled semiconductor wafer chuck system 10 is incorporated in an automatic wafer probe test station 12. A temperature-controlled semiconductor wafer chuck 14 is mounted on a prober stage 16 of the prober station. A top surface 18 of the chuck supports a semiconductor wafer (not shown) and incorporates conventional vacuum line openings and grooves 20 facilitating secure holding of the wafer in position on the top surface of the chuck. Vacuum lines connecting to a vacuum source are conventional and are not shown. A system controller and heater power source 22 is provided to control the temperature of the chuck 14. A chiller 24 cools and recirculates a coolant fluid through the chuck via umbilical 26, the chiller cooling being controlled by the system controller. A user interface is provided in the form of a touch-screen display 28 where, for example, a desired temperature for the top of the chuck can be input. Alternatively, the controller can accept instructions from the prober, or other external means, through standard communication interfaces.

Probe pins 23 are mounted on a probe card 25 and are connected to an electrical test system 21. By aligning the chuck 14 and wafer mounted thereon with the probe pins, and bringing it into contact, individual dies are connected to the electrical test system. Testing of each of the individual dies formed in a wafer under test is effected by sequential connection of dies and cooperative action of the electrical test system and the temperature-controlled semiconductor wafer chuck system with the prober station.

Figure 2:
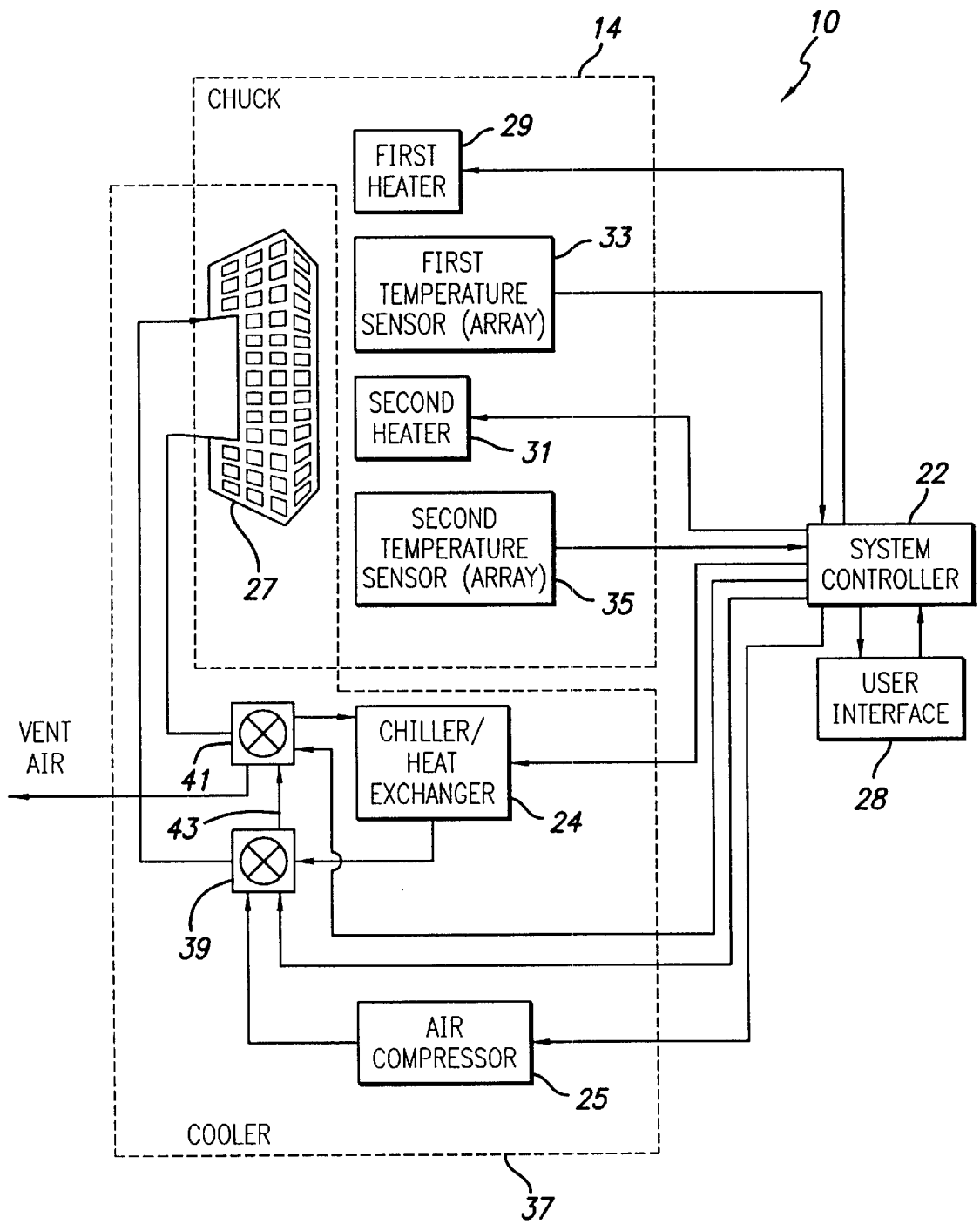
FIG. 2 is a schematic block diagram illustrating an exemplary temperature-controlled semiconductor wafer chuck system in accordance with principles of the invention.

With reference to FIG. 2, in a generalized schematic representation of the system 10 in accordance with principles of the invention, the chuck 14 includes a first or primary heater 29, a second or secondary heater 31, a first or primary temperature sensor 33, a secondary temperature sensor 35, and a cooler 37. The cooler includes a chiller 24 and/or an air compressor 25 outside the chuck and a coolant fluid conduit 27 within the chuck. Alternatively, in another embodiment a heat exchanger is used rather than a chiller, thermal energy being transferred to the atmosphere, and atmospheric temperature comprising a lower limit for cooling. However, faster cooling is possible if a chiller is used to cool the coolant fluid to a temperature below atmospheric. The cooler and the primary and secondary heaters are controlled by the system controller 22 in turn operated by an operator (not shown) through the user interface 28. As will be appreciated, the cooler can alternatively comprise another means of removing heat, for example a peltier device, or another refrigerative means, such as an evaporator, incorporated in the heat sink.

In one embodiment cooling of the chuck 14 is accomplished simply by blowing atmospheric air through the fluid conduit 27 by action of the compressor 25. In another embodiment a coolant fluid recirculates through the chiller 24 or a heat exchanger and the fluid conduit. In another embodiment a combination of capabilities for cooling is provided by both a chiller and an air compressor (air blowers are intended to be included in this term) and a controlled valving arrangement. A first valve apparatus 39 under control of the system controller 22 alternates the fluid source to the fluid conduit between the chiller and the air compressor. The first valve apparatus can itself comprise one or multiple valves conventionally actuated under electronic control. A second valve apparatus 41 under control of the system controller alternates fluid returning from the chuck between flowing to the chiller/heat exchanger 24 and venting to the atmosphere. If a liquid coolant is used additional provision can be made for purging the fluid conduit in the chuck and associated fluid lines in the umbilical 26 of liquid, as may be required, under automatic control before venting air directly to the atmosphere. Alternatively, the second valve apparatus can include an air trap and air vent valve (not shown), or equivalent structure, that allows air to be vented to the atmosphere but prevents liquid from escaping.

As will be appreciated in some production applications it may be desirable to reduce insofar as possible time spent cooling the chuck 14. As it can take some time to bring the chiller 24 and cooling fluid to a desired low temperature for cooling, the chiller can be run continuously and the cooling fluid recirculated so as to be continuously ready for cooling without need to start the cooler and bring the coolant fluid to the desired temperature. For this purpose in one embodiment a recirculating line 43 between the first valve apparatus 39 and second valve apparatus 41 is provided. Commensurately in this embodiment each valve apparatus is configured to selectively bypass or include the fluid conduit 27 of the chuck 14 in a fluid circuit traversed by the coolant fluid, and this can be in addition to functions described above.

Figure 3:
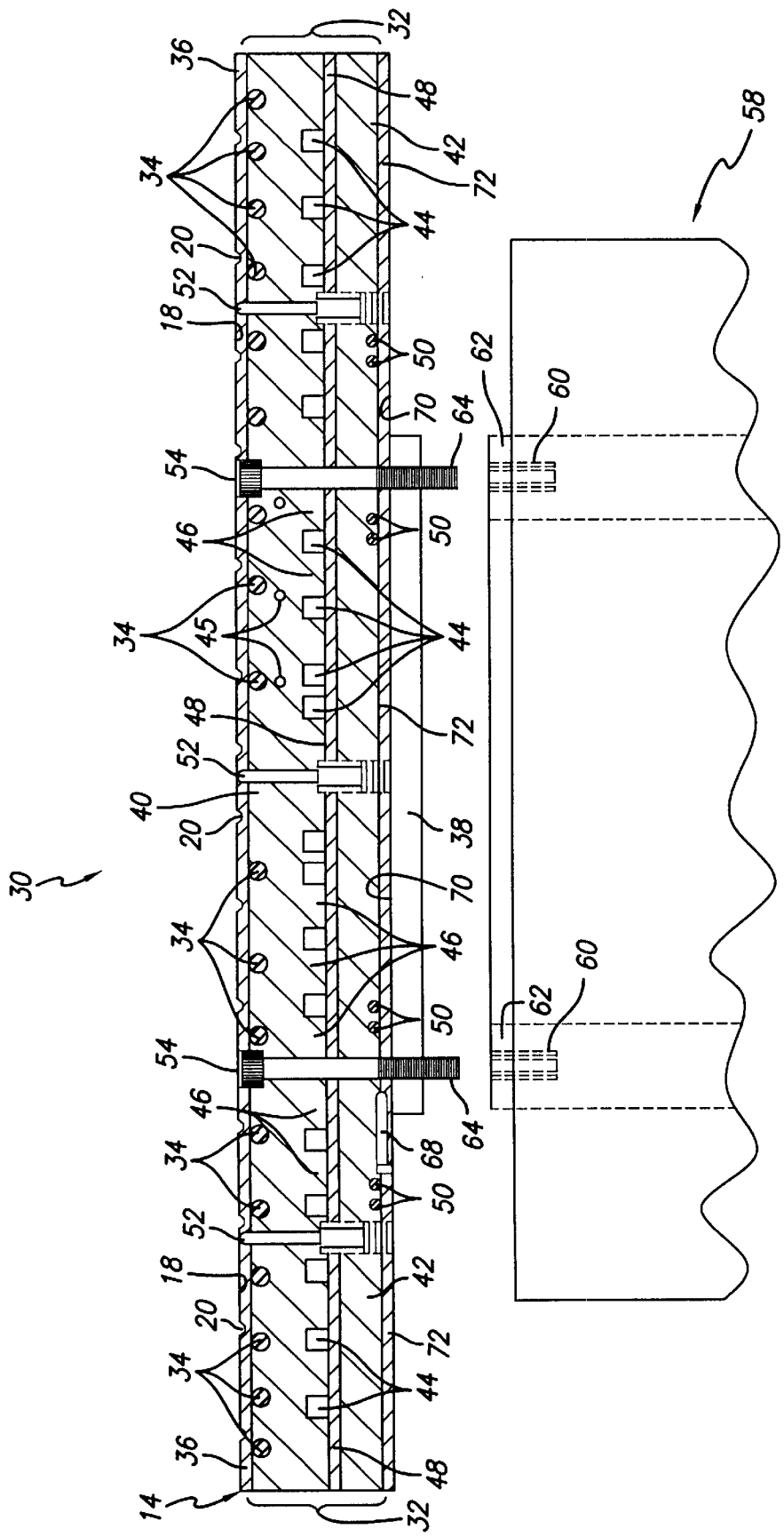
FIG. 3 is a cross-sectional view of a temperature-controlled wafer chuck showing the main elements in one exemplary embodiment illustrative of principles of the invention.

With reference to FIG. 3, a temperature-controlled chuck assembly 30 in one embodiment comprises a multi-layer heat sink 32, a first, or primary, heater coil 34, a chuck top plate 36 incorporating vacuum grooves 20. The chuck further comprises vacuum conduits 45, and includes a ceramic insulation layer 38 to thermally and electrically isolate the chuck. The heat sink comprises a heat sink core layer 40, a base layer 42, cooling channels 44, pillars 46, a cooling channel cover plate 48, a second, or secondary, heater 50, resistance thermal devices (RTD)(s) 52 and mounting holes 54.

In this illustrated embodiment a cooling fluid, liquid or air, recirculates through the cooling channels 44, to remove heat from the heat sink 32 to lower its temperature, or maintain the heat sink at a desired temperature when the primary heater 34 is activated for example. In another embodiment the cooling fluid is not recirculated, for example air can be forced through the cooling conduit 27 comprising the fluid channels and vented to the atmosphere as discussed above. In either case the atmosphere absorbs and dissipates thermal energy transported out of the heat sink by the air blown through the chuck or by means of air circulating through the hot (condenser) side of the chiller.

When heating of the chuck top surface 18 of a chuck top plate 36 is required, for example to raise the temperature of a semiconductor wafer (not shown) supported thereon, the primary heater 34, is activated. This heats the top of chuck 18 to the desired temperature, which is sensed by the RTDs. When cooling is required the primary heater 34 is switched off. The top of the chuck will cool down due to the action of the coolant in the cooling channels 44.

In this illustrated embodiment, the insulation layer 38 is formed of a nonconductive ceramic material which can sustain relatively high compressive force loads. The ceramic material is conventional for this application, and provides thermal insulation with respect to the prober stage 58 due to low thermal conductivity, and also electrical isolation of the chuck 14 from the prober stage due to low electrical conductivity. To further maintain electrical isolation of the chuck with respect to the prober an insulation material 62, such as a phenolic, is incorporated into the prober stage. Helicoils 60 are set into the phenolic and mounting bolts 64, are bolted through the mounting holes 54 into the helicoils.

In addition to heating the test wafer, a conventional temperature-controlled chuck can also conduct heat to the prober stage 58. This is undesirable for the reasons mentioned above. An additional function of a heat sink incorporated in a conventional chuck with a heat sink is to insulate the chuck base from the heating effect of the heater. The chuck base will be maintained at or close to the temperature of the heat sink. However, the temperature of the heat sink may be varied depending on the temperature required for the chuck. For example if the chuck is operating at or above +35° C. the heat sink may be cooled to +25° C. If the chuck is operating at −15° C. the heat sink may be cooled to −25° C. This variation in temperature from atmospheric temperature will affect the prober stage. The thermal insulator 38 does provide some insulation of the prober stage from this temperature differential. However, over production test times, which can be several days, the temperature of the prober stage can rise and fall significantly as the thermal deficit or excess of the heat sink with respect to the prober stage will be conducted to the prober stage.

In the chuck 14 of the exemplary embodiment shown in FIG. 3, the secondary heater 50 is fitted to the bottom of the heat sink, and when activated mitigates the demand for thermal energy from the prober stage due to the difference in temperature between the heat sink and prober stage. A second, or secondary, temperature sensor 68 or sensor array involving multiple temperature sensors (not shown) is provided to sense the temperature at a bottom surface 70 of the chuck. The secondary temperature sensor (s) employs RTD (s) in the illustrated embodiment. The secondary heater is controlled independently of the primary heater such that it works against the cooling effect of the heat sink and eliminates extreme variations in the temperature of the bottom of the chuck due to action of the primary heater, as well as the cooler, of the chuck. In this way the prober stage can be shielded from extreme temperature variations which may cause errors in positioning and/or damage to equipment due to thermal effects on the prober stage.

In one embodiment the system 10 maintains the chuck base within a desired temperature range, for example, 33° C. to 50° C. In another embodiment the secondary heater is controlled such that it works with the cooling of the heat sink to maintain the base of the chuck substantially at a desired temperature, for example the temperature of the atmosphere around the prober station. This mitigates and/or minimizes any thermal effect on the prober stage 58 from the extremes of changing temperatures of the chuck top 18 and heat sink 32.

Figure 4:
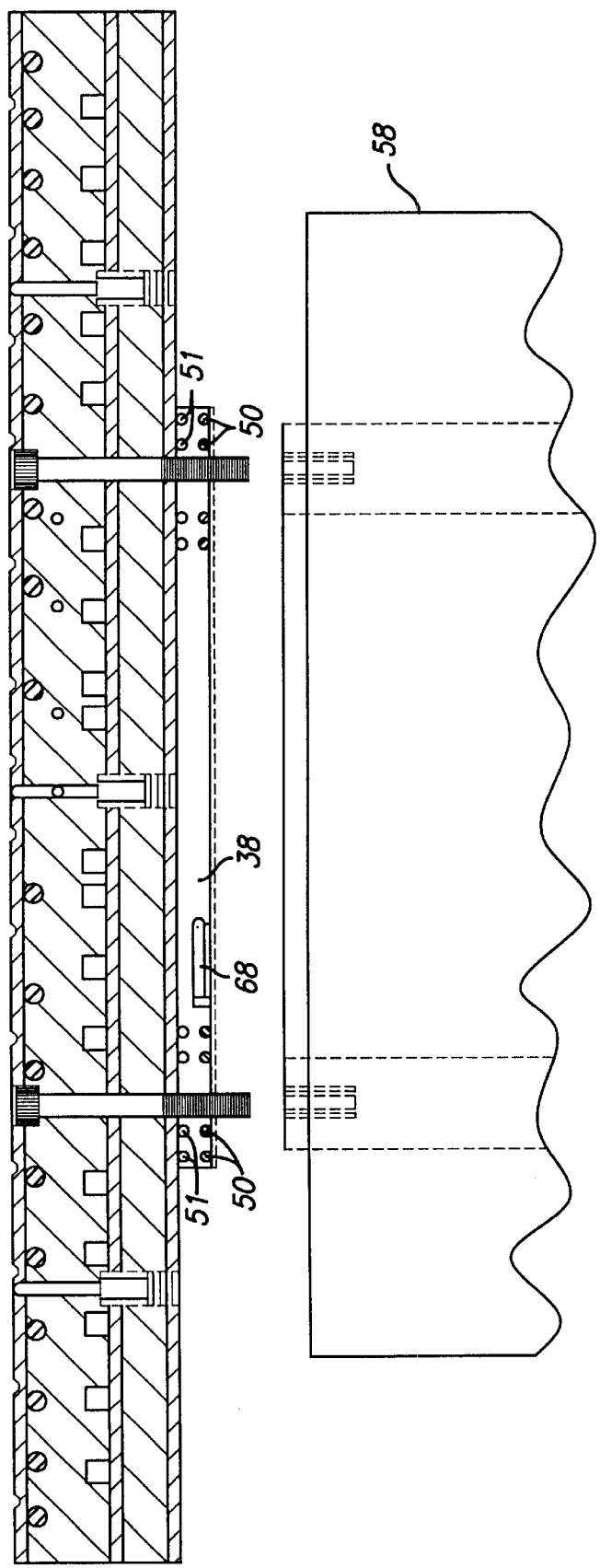
FIG. 4 is a cross-sectional view of a temperature-controlled wafer chuck showing the main elements in another embodiment in accordance with principles of the invention.

Another embodiment of the design is shown in FIG. 4 where the secondary heater 50 is fitted into the thermal insulator 38. In addition, air or liquid cooling channels 51 can be included in the thermal insulator 38 to aid cooling of the insulator to provide further control of the temperature of the base of the chuck. The secondary temperature sensor 68, or multiple sensors comprising a sensor array, is also located in the thermal insulator in this embodiment, adjacent the bottom of the insulator. In this way the temperature of the prober stage is sensed directly. This is particularly useful in regulating the temperature of the bottom of the chuck to minimize distortion of the prober stage.

In one embodiment the secondary temperature sensor 68 can comprise an array of sensors including an ambient temperature sensor located elsewhere on the prober stage 58 away from the chuck 14. In this case the system 10 can be configured to include in the programming of the controller 22 an algorithm for matching, as close as possible, the temperature of the bottom of the chuck to the ambient temperature of the prober stage.

In another embodiment two secondary heaters 50 are provided, one at the bottom of the heat sink 32 as shown in FIG. 3, and one at the bottom of the insulation layer 38 as shown in FIG. 4. This configuration allows lower temperatures for the chuck top surface 18 to be attained without undue cooling of the prober stage 58.

With reference to FIGS. 2, 3 and 4, the temperature of the top surface 18 and bottom surface 70 of the chuck 14 are independently controlled by controlling the current to the primary and secondary heaters 34, 50, respectively, and the temperature of the coolant fluid circulated through the coolant channels 44. In one embodiment, the temperature sensor(s) 52, which will comprise a device such as thermocouple or RTD, is mounted close to the chuck top surface 18 of the top plate 36 which feeds back the temperature of the chuck top to the temperature controller 22. If the chuck top is below the desired temperature the temperature controller will supply more current to the primary heater 34 thus heating the chuck top. If the chuck top is above the desired temperature power to the heater will be reduced or switched off and the chuck top will cool by the action of cooling fluid flowing through the fluid conduit 27 of the heat sink 32. In the same manner the secondary heater 50 in the chuck base, whether positioned at the bottom of the insulation layer 38, or adjacent a chuck bottom surface 70 defined by a chuck bottom plate 72, and the secondary temperature sensor(s) 68 are used to maintain the temperature of the chuck base and/or the prober stage 58 within a desired temperature range or close to ambient temperature.

The temperature of the top and bottom of the chuck 14 are in essence independently controlled by means of the primary and secondary heaters 34, 50. However, as the means of cooling the chuck, i.e. the heat sink 32 and chiller 24, is common to both, optimally the temperature of the coolant fluid flowing in the fluid channels 44 is always adjusted to, and maintained at, a temperature where the differential between the temperature of the heat sink and the desired temperature of both the top and bottom surfaces of the chuck can be made up by the primary and secondary heaters, respectively. However, as mentioned, in one embodiment coolant channels 51 are also incorporated in the insulation layer, which allows the heat sink to be maintained at a higher temperature without raising the temperature of the prober stage in that embodiment, as additional heat energy entering the insulation layer is intercepted by the coolant and carried away before reaching the prober station.

The means of control can be conventional, and feed back from the temperature sensors 52, 68 is used to adjust the temperature of the coolant, and the primary and secondary heaters 34, 50 respectively. For example, in one embodiment of the invention the chuck top 18 temperature is controlled using multiple RTDs 52 and averaging the sensed temperature at each location, with or without discarding the highest and/or lowest reading. In another embodiment one RTD can be used, and will control the chuck top temperature based on the feedback from that one point. As an example of this in one embodiment the array of sensors can be used somewhat unconventionally to locally control temperature on the top surface 18 of the chuck 14. In certain applications, the temperature of the chuck top can be changed locally due to the action of high power devices which themselves can heat the chuck top. This can cause localized hot spots on the chuck top at the device under test. In these cases it may be desired to control the chuck temperature top temperature based on the local temperature of the device under test. That is to say, to control the localized temperature, or to avoid any effects from hot spots and maintain the chuck at a desired temperature at a particular location. One method to achieve these requirements is to use multiple temperature sensors, for example in one design 5 RTDs are employed to detect the location of a hot spot.

A sampling circuit and software routine in the controller 22 allows programming of different algorithms to control the chuck temperature. For example to avoid control influenced by any hot-spots and provide an average temperature control, the algorithm may sample all sensors 52, ignore the highest, average the other four and choose the closest to this average to control the chuck temperature. Alternatively the algorithm may choose to average all five and choose the closest to the average. But if control to a localized temperature is desired, for example the location of a die in high or low temperature testing, the controller can be configured to enable operator selection of the closest temperature sensor, or in another embodiment selection of the sensor registering the highest temperature (which is assumed to be reading a higher temperature because of a localized hot spot due to the device under test producing heat there) for controlling the temperature. As will be appreciated in the latter embodiments a truer temperature reading for the particular die under test can be obtained. If an absolute minimum temperature limit is desired the lowest reading sensor can be used to trigger the limit. The same is true of an upper limit.

With multiple primary (and also secondary) sensors 52, 68 a self test feature is possible in addition to test and calibration routines involving an independent temperature sensor. With no devices under test to produce localized hot spots, the sensed temperatures from each sensor over a range of temperatures are compared each other and/or to stored values for sensors at the various locations. In the case where the sensed temperatures are compared only to each other, if all are within a preset differential range limit of each other a "pass" condition is set. Otherwise an error message and/or alarm is used to alert an operator to an out-of-range condition indicating a problem with one or more sensors or the controller 22.

Use of stored values to modify this process can be made to take into consideration the fact that a slight and consistent variation between readings is possible when coolant is circulating through the conduit 27 due to the fact that coolant will change temperature as it absorbs heat in transiting the fluid channels 44 from an inlet to an outlet (not shown, see FIG. 7) and a consistent increase in coolant temperature will be expected along the general path followed by coolant fluid resulting in a consistent temperature differential between local temperatures. This is mitigated, however, by the configuration of the fluid conduit in the illustrated embodiment (again see FIG. 7) wherein the inlet and outlet are adjacent one another. Local differences in geometry of the heat sink can produce local variation also. These variations are very slight but are consistent and can be accounted for in this way. In practice such variations are usually within acceptable error limits for the test as a whole and need not be accounted for in the testing of conventional devices, but with this methodology increased accuracy in temperature conditions for testing is possible, and requirements for such accuracy can be met if need be.

The temperature controller 22 of the system varies the current to the heater(s) 34, 50 in order to maintain the desired temperatures at the top 18 and bottom 70 surfaces of the chuck 14. Conventional temperature controllers vary the current to the heater in several ways but in general the changes are rapid in nature. The fluctuations in the current level result in changes in the electromagnetic fields produced by the heating elements and associated wiring. These electromagnetic fluctuations are coupled to the chuck top and are manifested by electrical noise on the test wafer and in the measurement circuits (not shown). It is highly desirous to minimize this electrical noise for more accurate measurements.

To minimize this noise it is necessary to minimize or remove rapid changes in the electrical current to the heaters 34, 50. In one embodiment the current to the heaters is controlled in an "analog" or "linear" manner. The temperature controller 22 does not fluctuate the heater current directly. Instead the temperature controller is monitored by the system controller which in turn varies the output of the heater power supply in an analog or linear manner. This method avoids rapid changes or fluctuations of the heater current which helps minimize associated electrical noise on the chuck top and in the measurement circuits.

Figure 5:
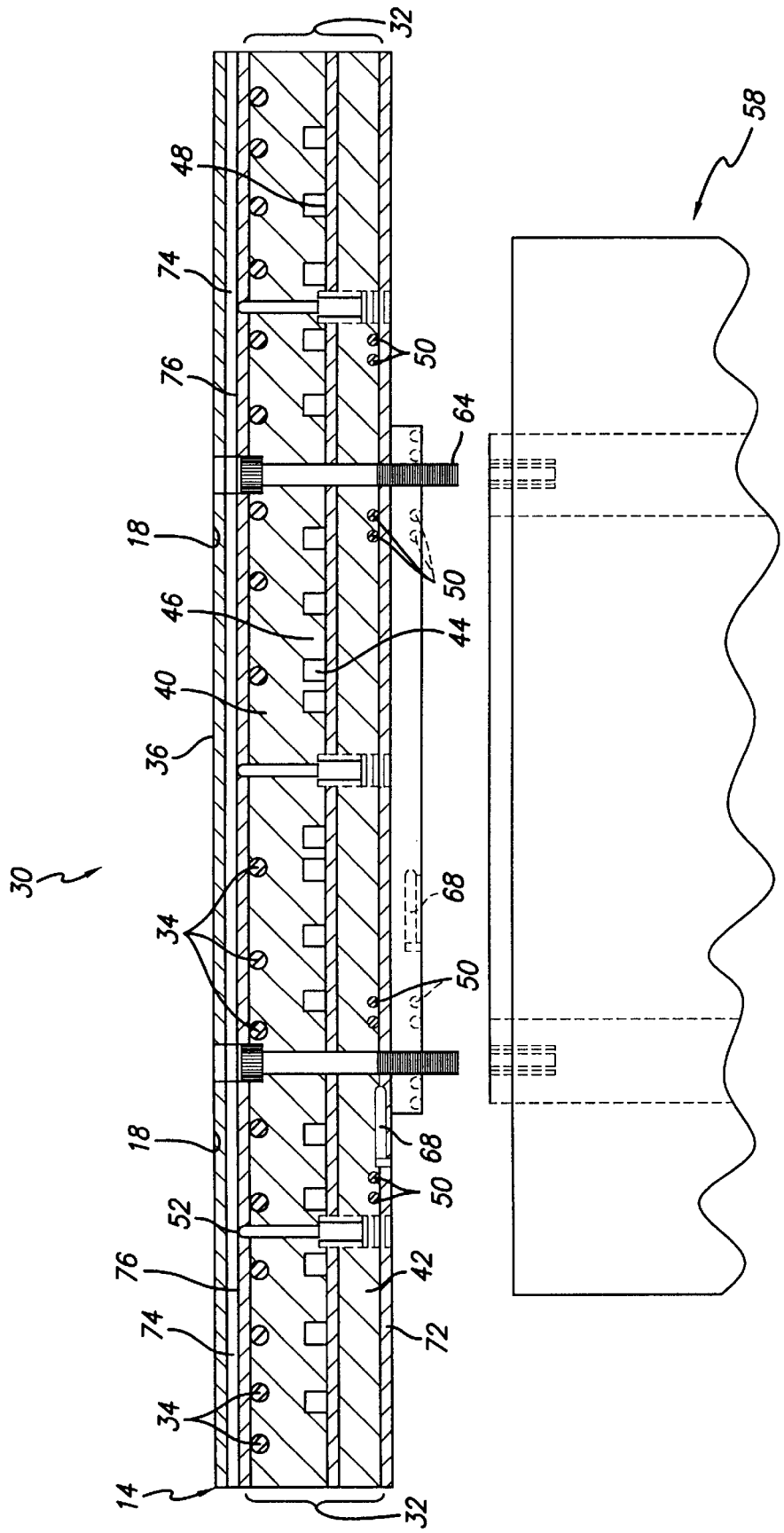
FIG. 5 is a cross-sectional view of a wafer chuck in another illustrative embodiment.

Another embodiment is shown in FIG. 5, wherein the chuck top surface 18 is electrically isolated from the primary and secondary heaters 34, 50 and heat sink 32 assembly. In this embodiment an additional isolation layer 74 and an additional primary heater cover plate 76 in addition to the chuck top plate 36 are added above the heat sink 32.

This arrangement can be used when making sensitive measurements on a test wafer (not shown). In certain test configurations it is required for the chuck top 18 to have good electrical isolation from the heater 34, heat sink 32 and prober stage 58. This is required to minimize leakage currents through the chuck 14, reduce electrical noise from the heaters and prober and also to allow the chuck top to be biased to a voltage if required. One method to achieve this is to add an isolation layer between the heater, heat sink and the chuck top itself, as shown.

The isolation layer 74 and chuck top plate 36 can be held in place by vacuum, ceramic bolts or other such means as to maintain electrical isolation from the chuck top to the heat sink 32. In this design the layers are held in place mechanically in a novel way as will be described below, and by vacuum conventionally such that electrical isolation is maintained. The configuration and assembly method to be described also allows movement both vertically and laterally such that the different layers 76, 74, 36 can expand and contract independently as the chuck heats and cools, avoiding warping and bowing.

Figure 6:
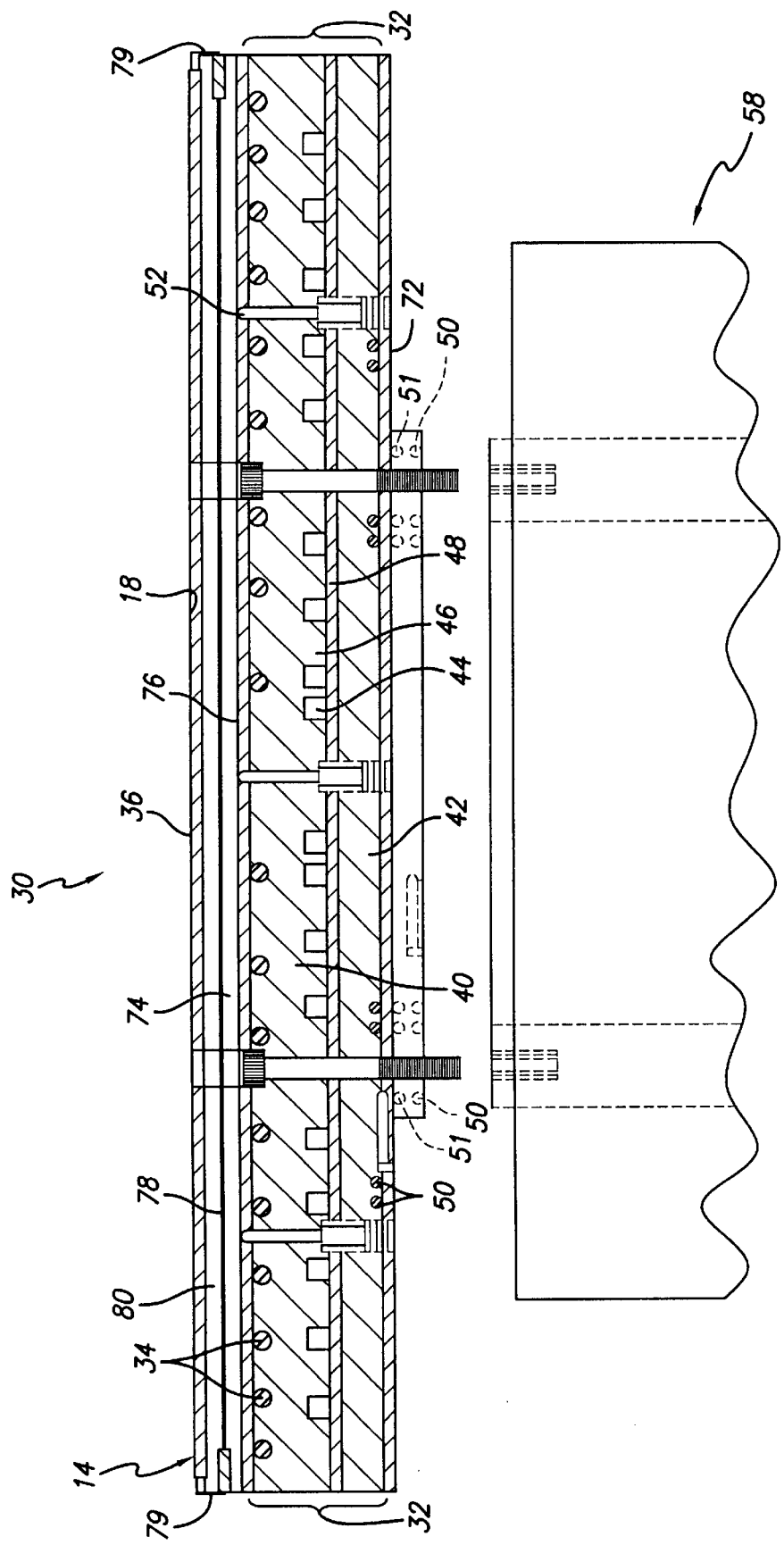
FIG. 6 is a cross-sectional view of a wafer chuck in further illustrative embodiment.

For even more sensitive test measurements on a test wafer, the temperature-controlled chuck 14 can be configured to allow triaxial or guarded measurements. Such an embodiment of the invention is shown in FIG. 6. An additional conductive layer 78, conductive guard ring 79 and an additional isolation layer 80 are added. The guard ring 79 is attached to the conductive layer 78 so that they are electrically connected and together form an electrically conductive guard layer. The measurement method called triaxial or guarded measurement is required for low noise and high isolation wafer probing applications, and further minimizes the effects of leakage currents and electrical noise on the chuck top 18.

In a guarded measurement the heat sink 32 is connected as the shield. The additional conductive layer 78 and guard ring 79 act as the guard and are brought to the same potential as the chuck top plate 36. As the voltage difference, or potential, across the additional isolation layer 80 is low, the leakage current that can flow from the chuck top to the guard layer 78, and the shield 32, is also low. The additional isolation layer, conductive layer, conductive layer and guard ring together comprising an electrically conductive guard layer also shield the chuck top from electrical noise that may be coupled from the heaters 34, 50 in the chuck or from motors (not shown) in or associated with the prober stage 58.

Figure 7:
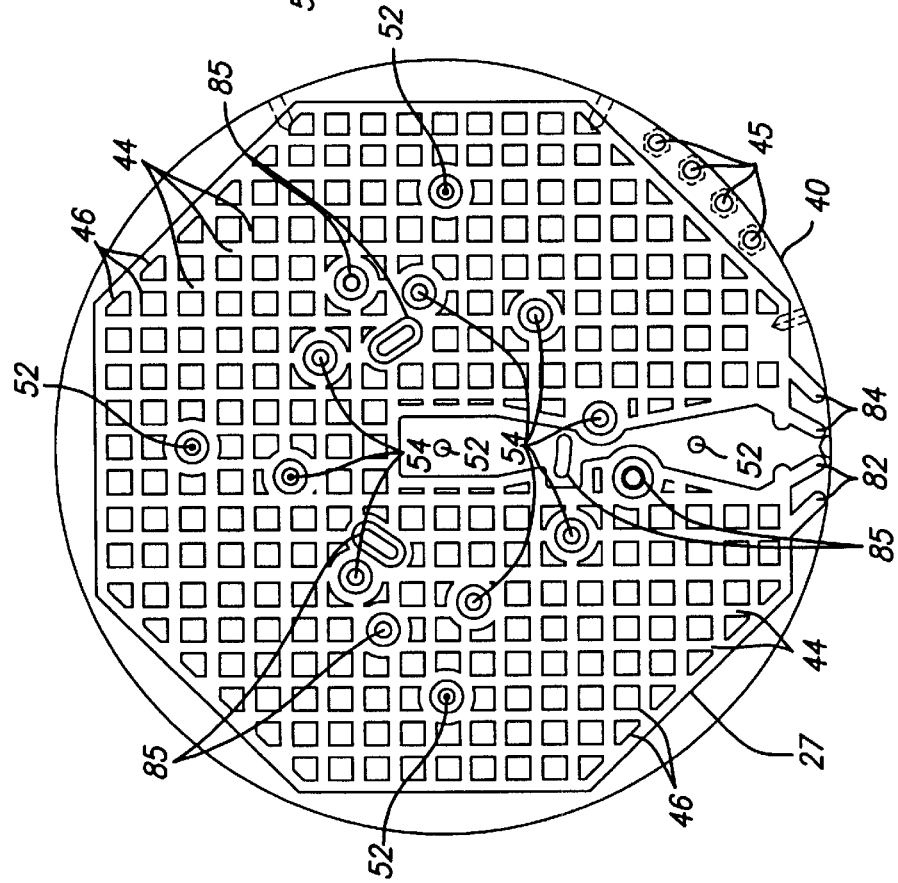
FIG. 7 is a bottom view of a heat sink layer of the wafer chuck shown in FIGS. 3–6.
Figure 9A:
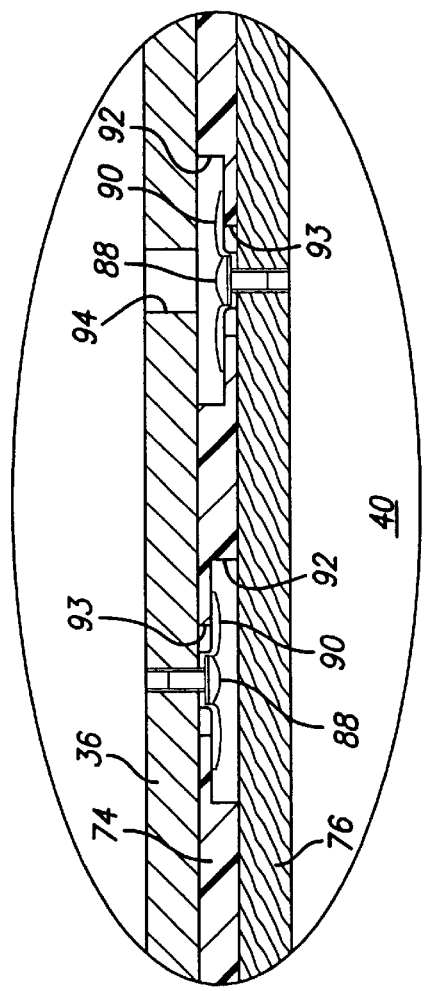
FIG. 9A is a cross-sectional view of a portion of the wafer chuck shown in FIG. 9, showing further detail regarding interconnection of the layers.
Figure 9C:
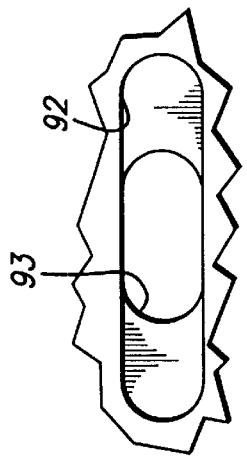
FIG. 9C is a top view in breakaway of a portion of the isolation layer shown in FIG. 9B showing an allowance for thermal expansion and contraction in the chuck assembly.
Figure 9B:
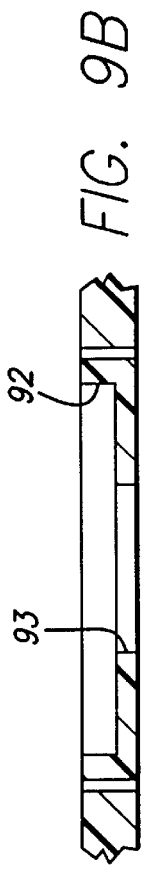
FIG. 9B is a cross-sectional view of a portion of an isolation layer of the chuck illustrated in FIG. 9 showing further detail of the interconnection of the layers.
Figure 9:
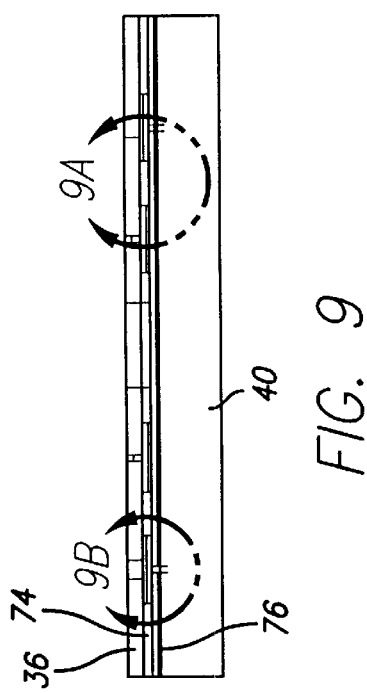
FIG. 9 is a cross-sectional view of a portion of the wafer chuck shown in FIG. 5 showing further detail regarding interconnection of the layers.

As mentioned, the chuck 14 in accordance with principles of the invention provides advantages in applications where higher loads are applied to the chuck from numerous probes acting in a relatively small area. With reference to FIGS. 6 and 7, the structural strength of the chuck 14 is derived from the design and construction of the heat-sink assembly 32.

The cooling conduit 27 including an inlet 82 and outlet 84, and numerous pillars 46 and cooling fluid channels 44 are incorporated in the heat sink core layer 40 constructed as shown, to achieve good cooling performance while at the same time maintaining high structural stiffness of the overall structure, particularly in resisting forces applied in a direction normal to the top surface 18 of the chuck. Either machining or casting the core material forms the cooling channels and the pillars. The cooling channels provide good circulation of the coolant while the pillars provide good surface area to conduct chuck heat to the coolant. The pillars, arranged as they are in a uniform pattern, also provide structural strength to the heat sink. For maximum strength the heat sink channels 44 are positioned in the middle of the layered heat sink assembly comprising the channel cover plate 48 and heat sink base 42 in addition to the core layer 40. The chuck bottom plate 72 and the chuck top cover plate 36 or primary heater cover plate 72 (depending on embodiment) are also integral with the heat sink as they are dip or vacuum brazed to the structure and accordingly further stiffen it.

The material used to form the heat sink 32 or its constituent layers can be various metals with good thermal conductivity and structural strength, such as aluminum or stainless steel. After the channels 44 and pillars 46 are formed, the cooling channel cover plate 48, is fitted and then dip-brazed or vacuum brazed such that all the edges of the core layer 40 and each pillar are brazed to the cooling channel cover plate.

Figure 8:
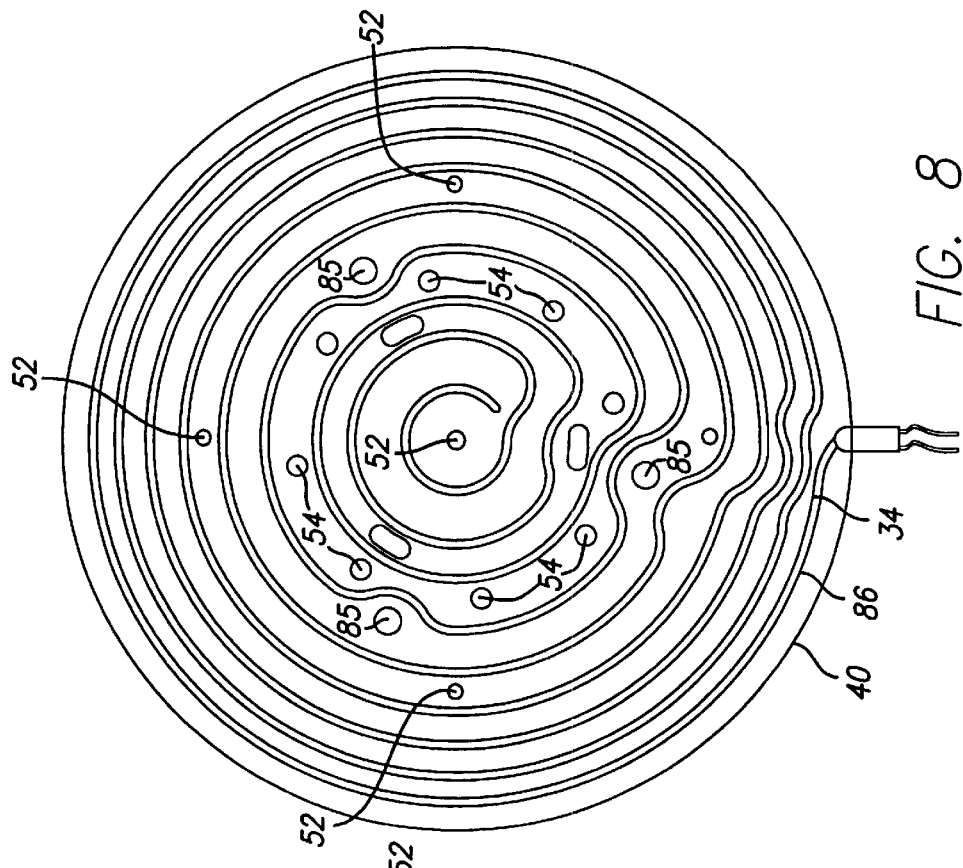
FIG. 8 is a top view of the heat sink layer shown in FIGS. 3–6, also showing a first, or primary, heater.

With reference to FIGS. 6, 7 and 8, the first or primary heater 34 in this embodiment is a stainless steel direct current resistance coil heater. Alternatively the heater can be of other construction such that it provides good temperature uniformity to the chuck top. In this embodiment heater channels 86, are machined or cast into the heat sink core layer top. The heater configuration is designed to give optimum temperature uniformity on the chuck top 18 and at the same time provide a chuck top surface resistant to probing forces. The heater is installed and the primary heater cover plate 76, is fitted. The assembly is vacuum brazed which connects the heater cover plate to the heat sink core layer and intimately connects the heater coil to the heat sink 32 and chuck top. Alternatively the heater can be cast into the heat-sink or achieve intimate contact by interference fit construction. The secondary heater 50, is installed in the same manner on the underside of the insulation layer 38 and/or the heat sink 32. The base layer 42 and the chuck bottom plate 72 comprising a secondary heater cover plate are dip or vacuum brazed to each other and the cooling channel cover plate 48 and heat sink core layer 40. Accordingly the heat sink 32 and a top and bottom cover plate 76, 72 respectively are intimately and integrally joined in a single unit, providing structural rigidity and good thermal energy transfer.

With reference to FIGS. 7 and 8, through holes 85 are included to facilitate loading pins (not shown) which pass through the chuck 14 for raising and lowering the semiconductor wafer onto the chuck. These holes are repeated in the other layers of the chuck construction.

As discussed above, it is generally required for the chuck top 18 to be electrically isolated from the heat sink 32 and prober stage 58. When additional isolation layers 74, 80 are added as in FIGS. 5 and 6, these can be held in place by vacuum, ceramic bolts or other such means as to maintain electrical isolation from the chuck top to the heat sink.

In one embodiment as shown in FIG. 5, the chuck top plate 36, isolation layer 74 and heat sink 32, 76 are assembled as shown in FIGS. 9, 9A, 9B and 9C. With reference to FIGS. 9, 9A, 9B and 9C, the isolation layer 74 is attached to the chuck top plate 36 by means of screws 88, and specialized clip washers 90 which are resilient and allow slip between layers and expansion of the isolation layer when tightened down by the screws. The screws and washers are installed in recesses 92 in the isolation layer. An identical though reversed arrangement is used to connect the isolation layer 74 to the primary heater cover plate 76 and heat sink core layer 40. The holes 93 in the isolation layers for the screws are oversize and slotted, which in combination with the screw and clip washer arrangement allow the layers to move against each other. As the chuck 14 heats and cools, the various components also heat and cool. Due to different thermal expansion coefficients of the chuck top plate 36 and isolation layer 74, these will expand and contract at different rates. If the layers are fixed together this can cause bowing or warping of a layer or the chuck itself as pointed out, and this arrangement mitigates this problem. As the chuck heats and cools the various layers can expand and contract laterally and vertically against each other thus minimizing the tendency to bow or warp.

After placement of washers 90 and screws 88 in recesses 92 of the isolation layer for connection of the isolation layer 74 to the cover plate 76 and heat sink core layer 40, assembly of the isolation layer to the chuck top 36 is carried out. The isolation layer and top plate combination is then assembled to the heat sink using the same method, accessing the screws through holes 94 in the top plate 36. Vacuum can be used to further hold the layers together. This configuration provides for secure mechanical attachment of the layers, maintains full electrical isolation between the chuck top and heat sink, and also provides for lateral and vertical movement of the layers as the chuck heats and cools.

Figure 14:
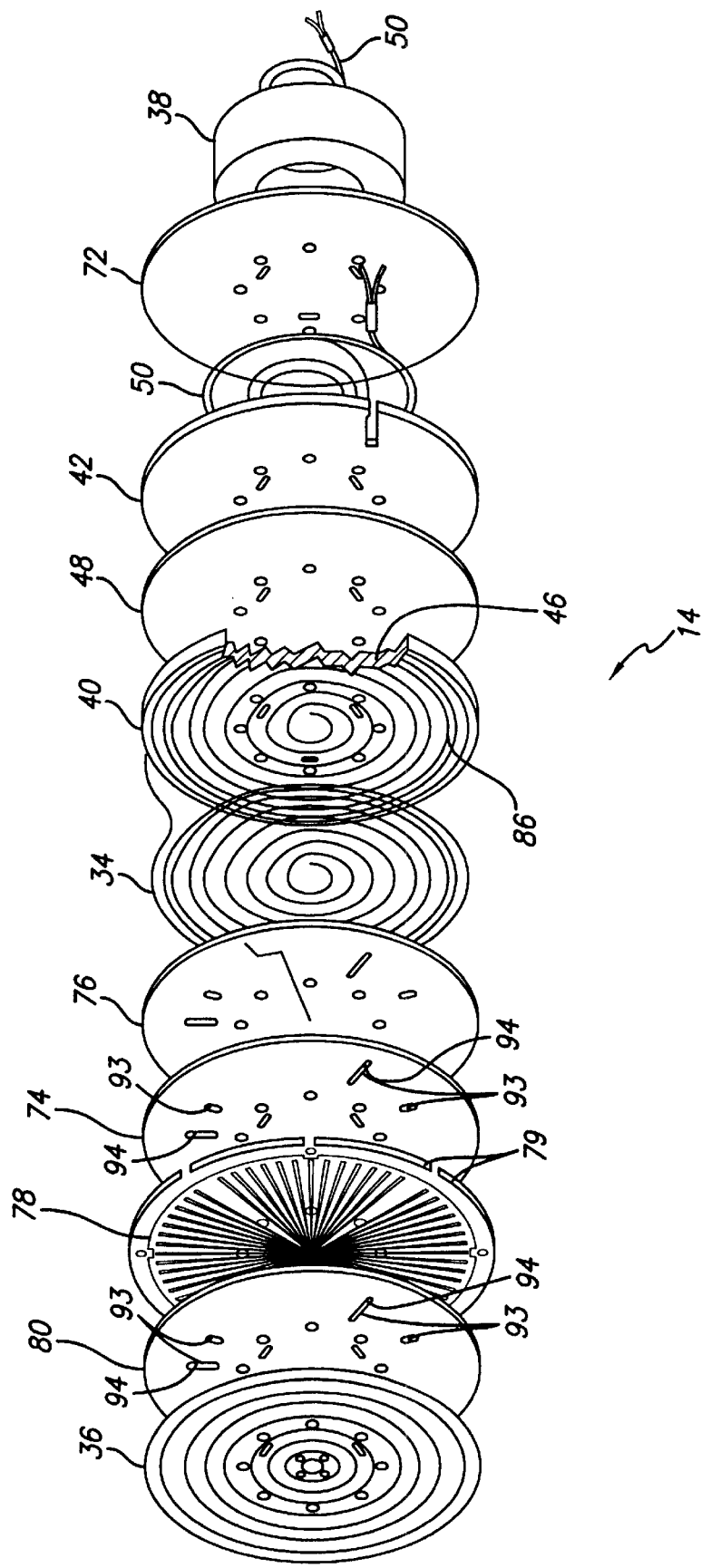
FIG. 14 is an exploded view of the wafer chuck shown in FIG. 6.

The embodiment shown in FIG. 6 including an additional conductive layer 78 and isolation layer 80, for triaxial or guarded measurements, is assembled in essentially the same manner, but including additional layers, as shown in FIGS. 10, 10A, 10B, 10C. An isometric view of the layers is shown in FIG. 14, and further illustrates the structure of the chuck 14 shown in FIG. 6. Analogous to the embodiment just discussed, the isolation layer 74 is bolted to the additional conductive layer 78 with the washers 90 and screws 88 pre-installed in the recesses 92 in the isolation layer. The assembly is then attached to the primary heater cover plate 76 and heat sink 40.

In a similar manner, the further isolation layer 80 is bolted to the top plate 36 with screws and washers pre-installed in the recesses in the further isolation layer. This assembly is then bolted to the additional conductive layer 78 by accessing the screws through the holes 94 in the chuck top 36.

A further embodiment is shown in FIG. 11. The top plate 36 is bolted to the further isolation layer 80 with specialized wing nuts 89 pre-installed in recesses 92 in the further isolation layer 80. The isolation layer 74, additional conductive layer 78 and the further isolation layer 80 are assembled using washers 90 and screws 88, with washers 90 pre-installed in the recesses 92 in the isolation layer 74. The combination is then attached to the heat sink using the same method, accessing the screws through the holes 94 in the chuck top 36.

Figure 13:
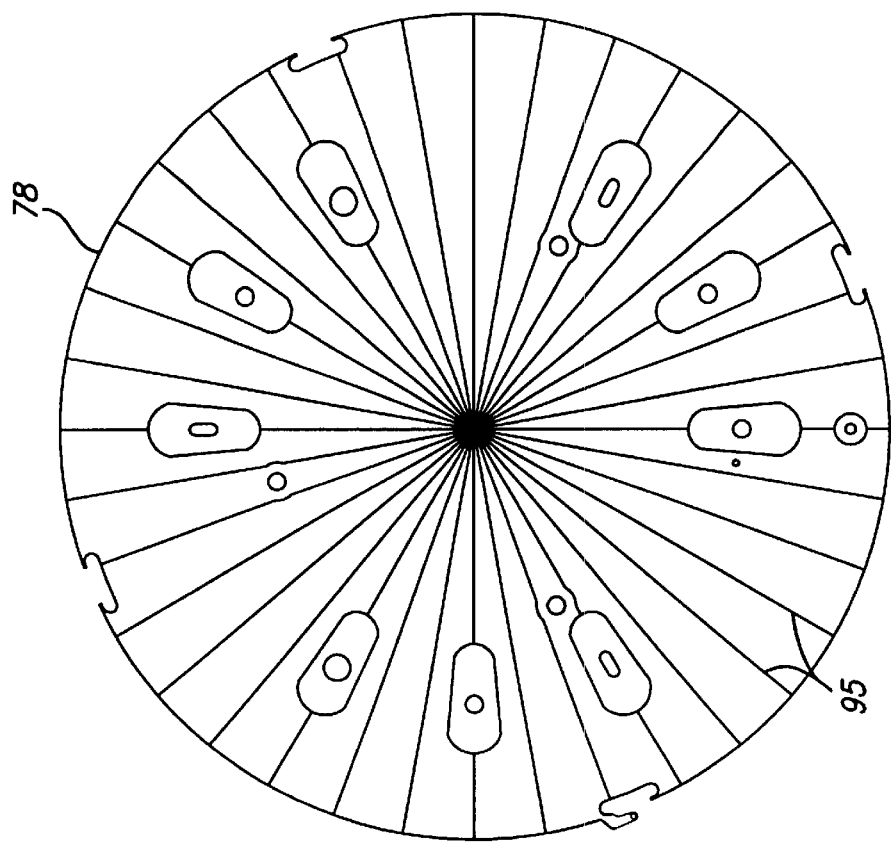
FIG. 13 is a bottom view of the further electrically conductive layer shown in FIG. 12.
Figure 12:
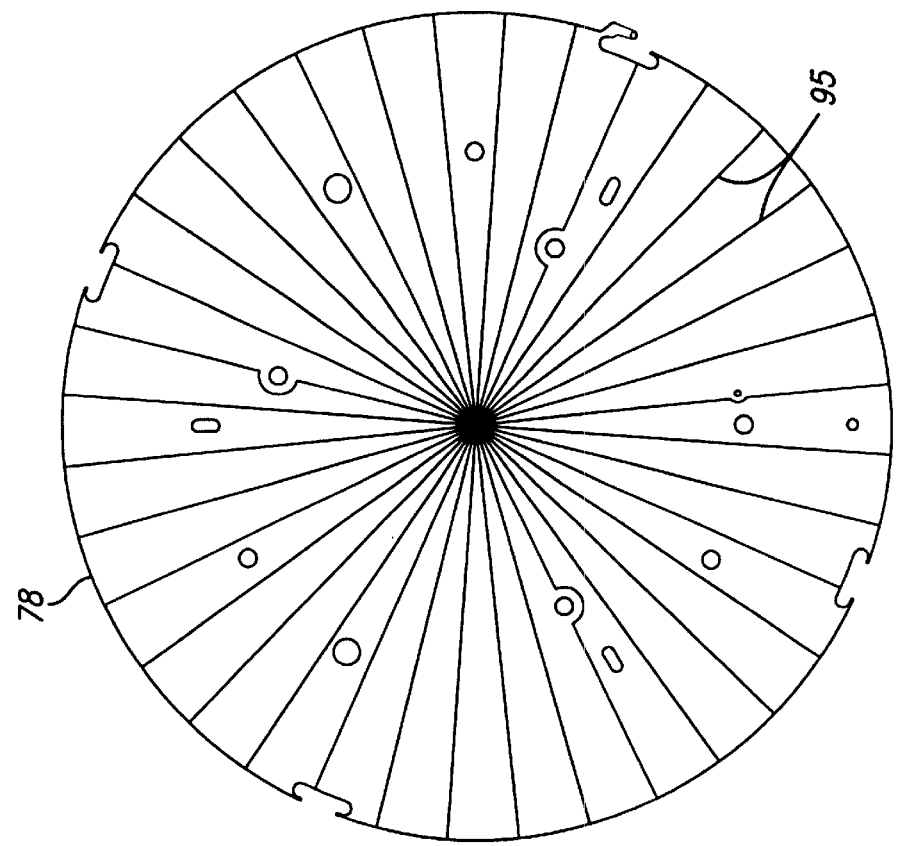
FIG. 12 is a top view of the further electrically conductive layer shown in FIGS. 6, 10 and 11 showing further detail.

Additionally, as mentioned, vacuum can be used to further hold the layers together by creating a vacuum between the layers. With reference to FIGS. 12 and 13, vacuum grooves 95 are formed in the top and bottom surfaces of the additional conductive layer 78. These are in fluid communication with a vacuum conduit (not shown) incorporated in the chuck 14. The grooves are configured such that the additional conductive layer 78, the further isolation layer 80, and the isolation layer 74 will be held together upon application of vacuum. In a similar manner vacuum grooves (not shown) on the rear of the chuck top 36 and on the primary heater cover plate 76 will further help to hold the assembly together when vacuum is applied.

With reference to FIG. 14 the construction of the temperature-controlled chuck 14 is further illustrated by separate depiction of the major component parts in order in exploded view. As will be appreciated the chuck shown includes the elements employed in the embodiment illustrated in FIG. 6. However, by deletion of appropriate elements the other embodiments can be visualized as the remaining elements in each case appear in order in the layered construction.

As will be apparent to those skilled in the art, the temperature-controlled semiconductor wafer chuck system 10 in accordance with principles of the invention provides advantages over conventional thermal chucks in mitigating distortion of the chuck 14 or prober stage 58 due to thermal effects and/or application of relatively high probing loads. Electrical isolation of a wafer under test can be improved by adding isolation layers and/or a guard layer without compromising dimensional stability due to differential expansion and contraction of the multiple layers of differing materials.

While the invention has been illustrated and described in relation to presently preferred embodiments, it will be understood that various modifications can be made within the spirit and scope of the invention. It is to be understood that the invention is not to be limited to the disclosed embodiments, and the scope is to include all variations and modifications within the scope of the invention as set forth in the appended claims.

FIGS. 15–18, illustrate by way of example another embodiment of the present invention, a chuck 100, which is arranged to provide low thermal resistance and low electrical noise. By way of background, the thermal resistance of a chuck may be defined as chuck's capacity to take heat away from the device (such as a wafer), so that a chuck with low thermal resistance can take heat away from the device at a faster rate than a chuck with high thermal resistance. Thermal resistance between a device and the chuck is defined as the change in temperature of the device divided by the total power. Thermal resistance depends on a number of factors, such as, the device size, interface force between the device and the chuck, surface hardness, surface flatness, material, and construction of the chuck.

When a high power device is activated it will heat up. Thus when testing a high power device the test temperature will be the temperature reached by the device. Moreover, the temperature reached by the device depends on such factors as device power, thermal resistance of the device/chuck interface and the temperature of the chuck itself. In general, the device will heat up by an amount dependent on the power of device and the thermal resistance of the device/chuck interface. For example, a 50 W device on a chuck with a thermal resistance of 2° C./W will heat up by 100° C. (50 W*2° C./W). The temperature increase of the device, above the chuck temperature, is largely independent of the chuck temperature.

Lowering the thermal resistance of a chuck, reduces the temperature increase of the device and allows the chuck to test devices at a higher temperature. To test a device at a required temperature, the temperature of the chuck must be set below the test temperature by the amount the device itself will heat up. For example, if a test required testing a 50 Watt (W) device at a test temperature of +75° C., and the chuck had a thermal resistance of 2° C./Watt (C/W), then the chuck should run at −25° C. to test the device, i.e., required chuck temperature=[+75° C.−(50 W*2° C./W)]=−25° C. However, for the same test condition, if the chuck had a thermal resistance of 1° C./W, then the chuck can run at +25° C., i.e., required chuck temperature=[+75° C.−(50 W*1° C./W)]=+25° C. A chuck temperature of +25° C. is far easier to implement than −25° C.

In some instances, a chuck with high thermal resistance may not be able to test the device at all. For example, it is not uncommon to test a 100 W device with a size of 10 mm×10 mm at a test temperature of +75° C., where the chuck may have an approximate thermal resistance of 1.5° C./W. Here, the chuck would have to run at −75° C., i.e., required chuck temperature=[+75° C.−(100 W*1.5° C./W)]=−75° C. which can be difficult to implement. On the other hand, if the chuck had a thermal resistance of 0.7° C./W, then the chuck can run at +5° C., i.e., required chuck temperature=[+75° C.−(100 W*0.7° C./W)]=+=+5° C. which can be readily done. Therefore, a chuck with a lower thermal resistance transfers heat away from the device at a faster rate; and at the same time, expands the temperature range in which the device can be tested. Accordingly, one of the objective of this embodiment is to lower the thermal resistance of the chuck.

With regard to the electrical noise, there are applications where the chuck itself is grounded so that electrical noise is not a problem; however, there are many instances where it is preferable to have the chuck ungrounded, electrically floating or connected to a bias voltage. In such instances, electrical noise within the chuck can hinder the testing of the device. The electrical noise, for example, may be produced from a heater coil within the chuck used to control the temperature of the chuck. That is, as the current in the heater is varied to control the temperature of the chuck, the voltage across the heater coil increases and decreases. This voltage can be capacitively coupled to the chuck itself. Accordingly, any variations in the current or voltage on the heater coil can be coupled to the chuck itself. Additionally, electrical noise in the power line can induce the heater to be electrically noisy, which in turn can be coupled to the chuck itself and appear as electrical noise on the chuck. Therefore, another objective of this embodiment is to minimize electrical noise on the chuck. without grounding the chuck.

Yet another objective of this embodiment is to minimize the number of parts in manufacturing the chuck, to lower the cost in producing the chuck.

Figure 15:
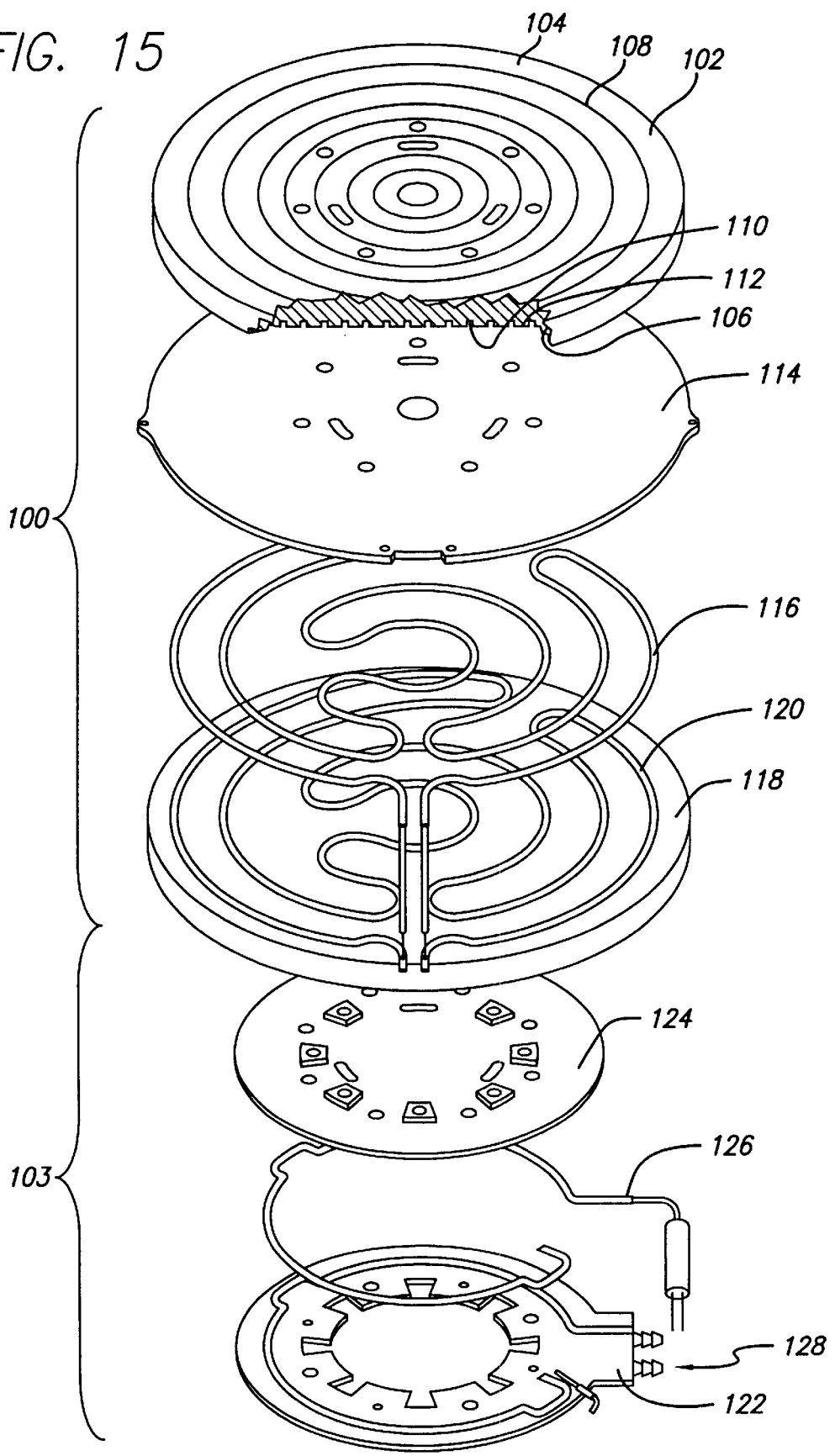
FIG. 15 is an exploded view of yet another exemplary embodiment of a wafer chuck in accordance with the present invention.

As illustrated by way of example in FIG. 15, the chuck 100 accomplishes the above objectives, which includes a heat sink core 102 with a top side 104 and a bottom side 106. Along the top side of the heat sink core 102 are vacuum grooves 108 to provide a region of low pressure to hold the device in place. Along the bottom side 106 of the heat sink core 102 are cooling channels 110 and intermixed between the cooling channels are pillars 112 forming substantially a planar surface. As in the previous embodiment, a variety of cooling fluids may be recirculated through the cooling channels to cool the heat sink core. Note that the cooling channel is distributed substantially in a uniform manner to cool the heat sink core uniformly.

To enclose the cooling channels, a cover plate 114 is coupled to the heat sink core along the bottom side 106. On the other side of the cover plate 114 is a base layer 118 that has grooves 120 corresponding to the configuration of the primary heater 116 and the primary heater 116 is disposed within the groove 120. Accordingly, a multi-layer sink 101 (see FIG. 16) is formed which includes the heat sink core 102, cover plate 114, and base layer 118.

To couple or mount the chuck 100 to the prober stage (not shown in FIG. 15), a prober adapter 103 is provided underneath the chuck. The prober adapter includes an insulation layer 124 and an adapter heatsink 122. To minimize the thermal stresses between the chuck and the prober stage, the insulator layer 124 acts as a thermal barrier and reduces transfer of heat between the chuck and the prober stage. To further minimize the thermal stress on the prober stage, the adapter heatsink has secondary cooling channels 128 and a second heater 126. In other words, by controlling the current to the second heater and/or the flow of coolant into the secondary cooling channels 128, the temperature of the adapter heatsink and the insulator layer can be controlled, to be higher or below the temperature of the chuck, to minimize the thermal stress on the prober stage. That is, to maintain the temperature of the prober stage at some preferred operating temperature the prober adapter is used to off set the extreme temperatures of the chuck.

For example, the system controller 22 (see FIG. 2) may be programmed to maintain the temperature near the prober stage at an ambient temperature of 30° C. +/−5° C. In such as case, when the chuck is operating at a temperature above +30° C., the system controller 22 directs coolant to the prober adapter 103 to off set the heat generated by the chuck. Conversely, when the chuck is operating at a temperature below +30° C., the system controller 22 activates the secondary heater in the prober adapter to maintain the temperature near the prober stage near +30° C. As an example, a chuck may operate at temperatures between −65° C. and +200° C., which can effect the positional accuracy of the prober stage that has complex movements to allow probing of the device. Accordingly a prober adapter that can off set the extreme temperatures of the chuck is another advantage to the present invention. Of course, the system controller may be programmed to maintain the temperature of the prober stage at any desired temperature.

Figure 16:
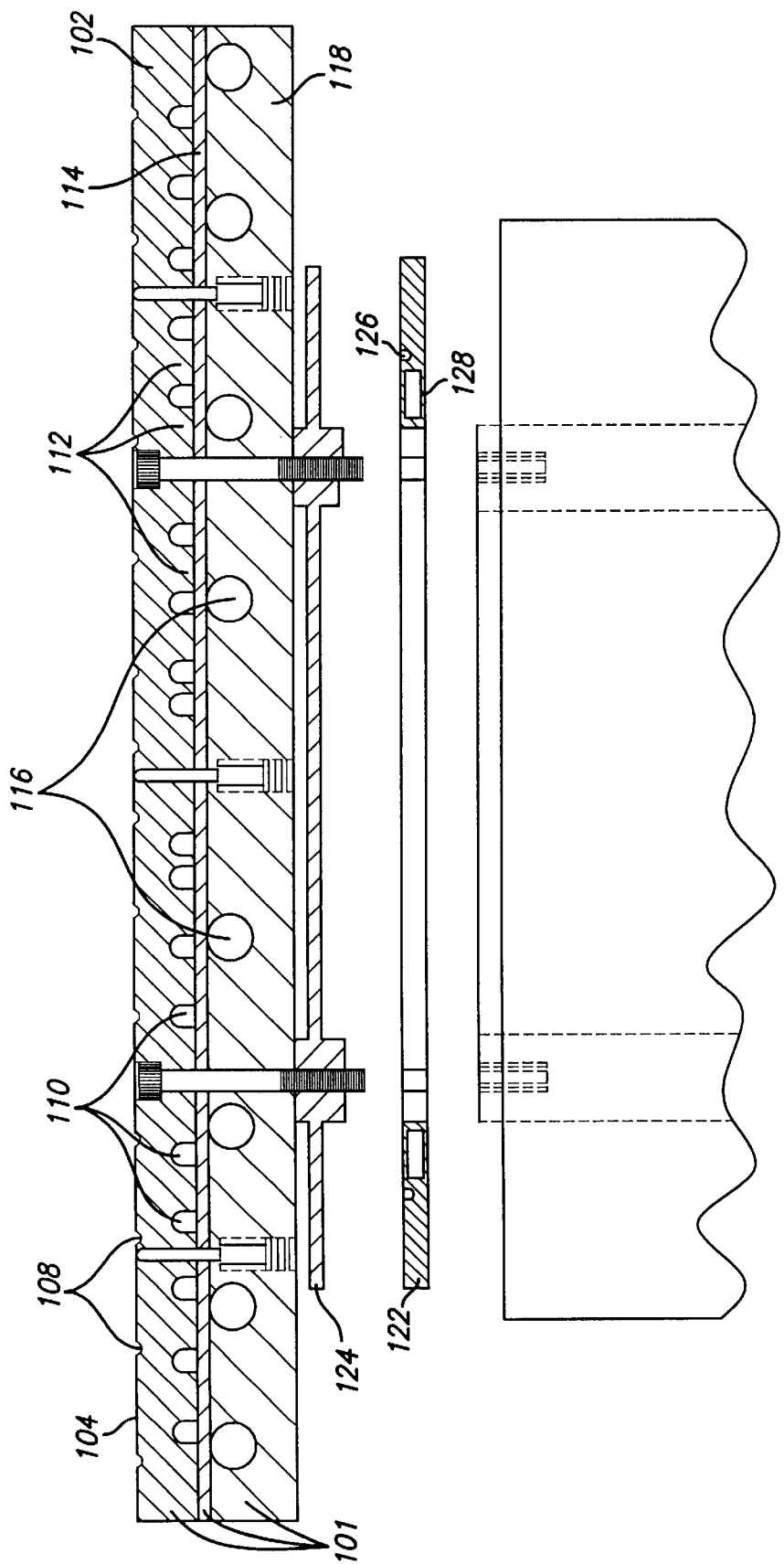
FIG. 16 is a cross-sectional view of the assembled wafer chuck shown in FIG. 15.

The adapter heatsink 122 may be formed from two disks sandwiched together having cavities for the secondary cooling channels and the second heater, as illustrated by way of example in FIGS. 15–16. The adapter heatsink, for example, may be made of two aluminum disks for its high conductivity, which are brazed together, or any other materials known to one of ordinary skill in the art.

As illustrates by way of example FIG. 16, once the chuck 100 is assembled, the cooling channels 110 are closer to the top side of the heat sink core 104, which hold the device, than the primary heater 116. One of the advantages with this arrangement is that it reduces the thermal resistance of the chuck for several reasons. One of the reasons is that the cooling channels are closer to the device than the previous embodiments so that the cooling channels can transfer heat away from the device at a faster rate. In other words, in this embodiment, the thermal resistance is reduced because there is less conductive distance between the device and the cooling channels.

Another reason the thermal resistance is reduced in this embodiment is that the heater is not adjacent to the top side 104 of the heat sink core 102. Moving the heater below the cooling channels reduces the thermal resistance because the heater generally has an insulating layer enclosed by a stainless steel wall, while the sink core is generally made of aluminum or other material with good thermal conductivity that have much better thermal transfer properties than the insulating layer with the stainless steel wall. In other words, having a heater made of stainless steel and insulating material disposed adjacent to the top side of the heat sink core is less efficient at transferring heat away from the device versus a solid aluminum heat sink core.

Therefore, with the embodiment disclosed in FIG. 16, i.e., having the cooling channels 110 above the primary heater 116, the thermal resistance of the chuck is reduced to transfer heat away from the device quickly and expand the temperature range in which the device can be tested. For example, with the embodiment disclosed in FIGS. 15–18, a thermal resistance of less than 1° C./W may be achieved for a device size of 10 mm by 10 mm.

Figure 18:
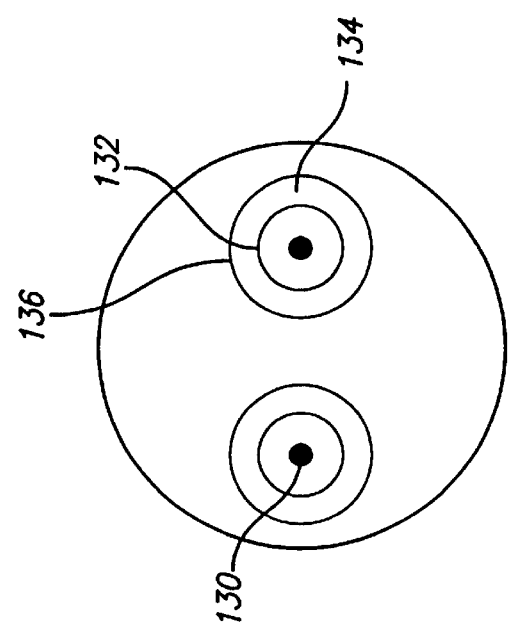
FIG. 18 is a cross-sectional view of the encircled area of FIG. 17.
Figure 17:
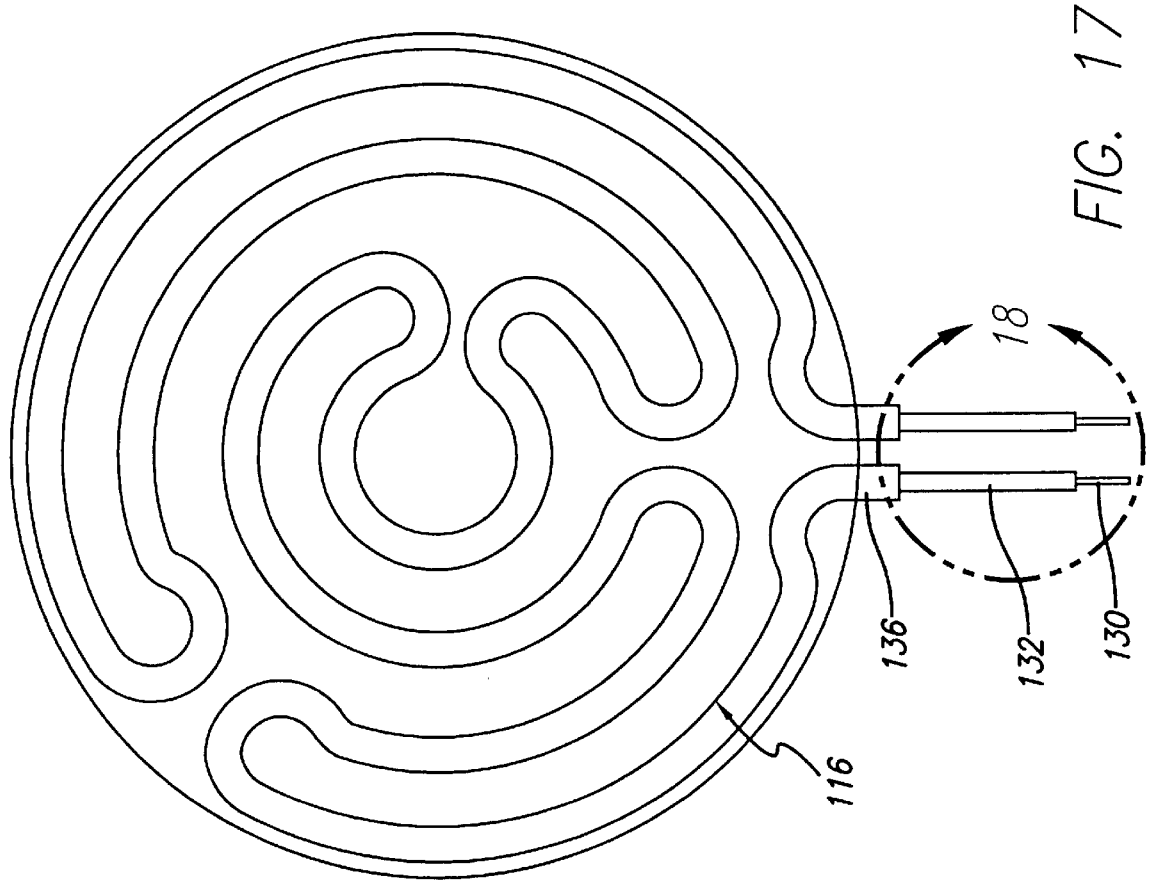
FIG. 17 is a top view of a primary heater with an exemplary configuration within the wafer chuck shown in FIG. 15.

As illustrated by way of example in FIGS. 17 and 18, the primary heater is configured to uniformly distribute the heat and eliminate any voltage or electrical noise from the heater that may be induced on the chuck. To eliminate the electrical noise, FIG. 18 shows an exemplary cross-sectional view of the primary heater, which includes a heating coil 130 enclosed by an inner wall 132, wherein between the heater coil and inner wall is a first insulator layer 133 made of electrically non-conductive material such as magnesium oxide powder or ceramic. Further enclosing the inner wall 132 is an outer wall 136, wherein between the inner and outer walls is a second insulation layer 134. With regard to material, the inner and outer walls may be made of the same or different materials, such as aluminum and stainless steel.

Additionally, in a typical test configuration, the inner wall 132 of the primary heater is grounded so that any voltage and/or electrical noise on the heater coil is coupled to ground rather than being coupled onto the outer wall and the chuck itself. As the inner wall completely encloses the heater coil, and when gounded there is minimal voltage or electrical noise on the inner wall, so that no voltage or electrical noise from the heater can be coupled to the outer wall and the chuck itself. Without the grounded inner wall, any voltage or electrical noise on the heater could be coupled to the outer wall and the chuck itself where it would appear as voltage, current or electrical noise. Therefore, even without the chuck being grounded, the double wall construction of the primary heater with the insulation layer between the two walls and the inner wall grounded prevents any electrical noise within the chuck. Alternatively, guard voltage may be applied to the inner wall to shield the heater from the chuck, or other methods known to one ordinarily skilled in the art. The primary heater such as the one illustrated in this embodiment is manufactured by Watlow Electric Manufacturing Co., 12001 Lackland Rd., St. Louis, Mo. 63146; telephone number 314/878-4600.

Alternatively, the primary heater 116 may be formed with the heater coil and the first insulation layer within the inner wall and the second insulation layer enclosing the inner wall. The outer wall however may be the cavity within the base layer itself configured to receive the primary heater. Here, the base layer or the chuck is insulated from the heater coil because of the insulation layer 134 between the inner wall 132 and the cavity within the base layer. Alternatively, any other method of insulating the heater coil from the chucks known to one ordinarily skilled art may also be used.

As further illustrated by way of example in FIG. 17, the primary heater is configured to uniformly distribute the heat within the chuck. Still further, as illustrated in FIG. 16, the primary heater 116 is placed underneath the cover plate 114, and in between the top side 104. The cover plate 114 and pillars 112 spread the heat generated from the primary heater so that the heat is more uniformly distributed to the top side. Along with the pillars, the conductive distance between the top side and the cover plate further ensures that the heat transfers laterally across to distribute the heat across the top side more uniformly. Therefore, having the primary heater further away from the top side than the cooling channels not only reduces the thermal resistance but it also uniformly distributes the heat across the top surface.

Furthermore, the chuck 100 has fewer parts than the chuck 30 in the previous embodiment. That is, the chuck 100 does not require, for example, the chuck top plate 36, as in the previous embodiment so that the cost of producing the chuck 100 is reduced.

Yet another advantage with the arrangement of the chuck 100 is that the cooling channels 110 and the primary heater 116 are substantially along the centerline of the chuck so that the heat is distributed and drawn to the cooling channels evenly throughout the chuck, so that the chuck will expand and contract uniformly. The uniform expansion and contraction of course will minimize any deflection on the chuck and thermal stresses on the chuck.

Figure 19:
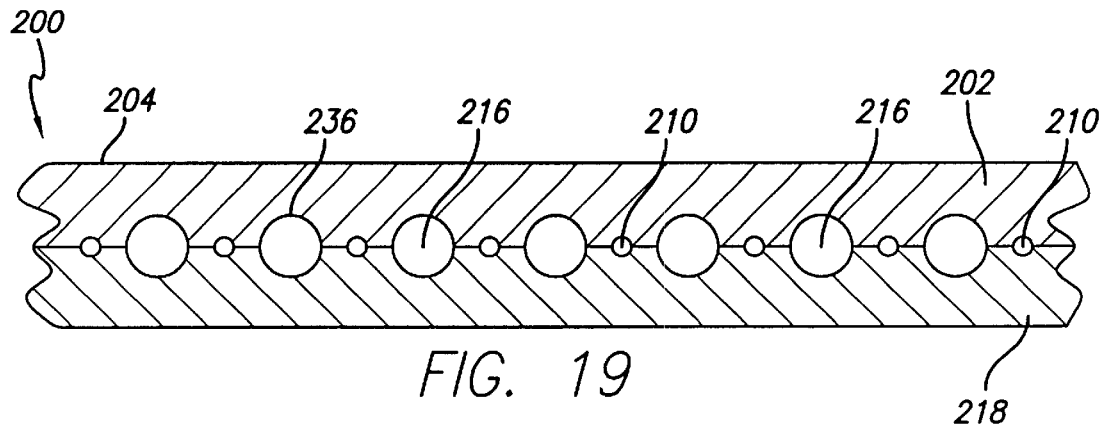
FIG. 19 is a cross-sectional view of yet another embodiment of a multi-layer sink in accordance with the present invention.

FIG. 19, illustrates by way of example yet another embodiment of the present invention, a chuck 200 includes a top sink core 202 with a top side 204, and a bottom sink core 218. The top and bottom sink cores have cavities to form cooling channels 210 and outer walls 236 adapted to receive a primary heater coil 216, when the top and bottom sink cores are vacuum brazed together. Here, the primary heater 216 and the cooling channels 210 are formed on substantially the same plane so that the top side 204 can be cooled and heated quickly. Additionally, the primary heater 216 and the cooling channels 210 may be formed, for example, along the centerline of the chuck to more uniformly distribute the heat and draw heat to the cooling channels. Note that in this embodiment, the outer wall of the primary heater 216 may be formed by the cavities in the top and bottom sink cores 202 and 218, respectively. Alternatively, the cavities for the heater and cooling channels may be formed in either to top or bottom cores, respectively.

Figure 20:
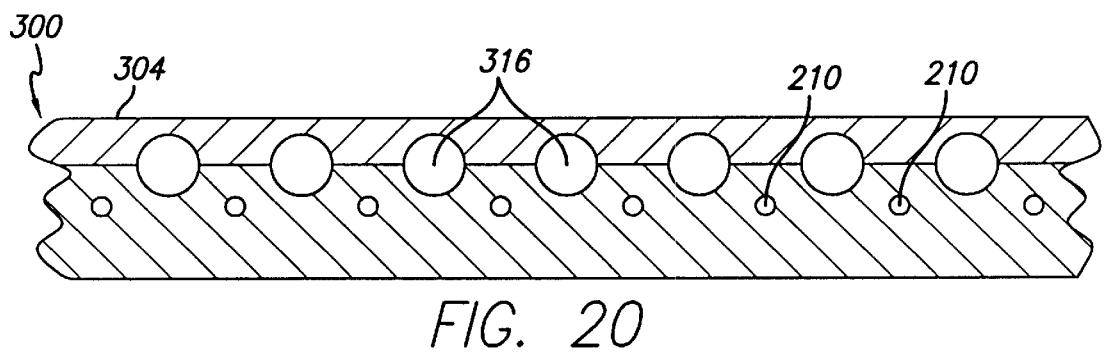
FIG. 20 is a cross-sectional view of still further embodiment of a multi-layer sink in accordance with the present invention.

As illustrated by way of example in FIG. 20, a chuck 300 having a primary heater 316 between the top side 304 and the cooling channels 210 is within the scope of the present invention. This embodiment allows the heat to be transferred to the device at a faster rate because there is less conductive distance between the device and the primary heater. Alternatively, a plurality of primary heaters may be used to deliver more uniform heat throughout the chuck. More than one primary heater may be needed to deliver more uniform heat with the double wall heaters because they cannot bend as tightly as the single wall heaters which can be configured to deliver more uniform heat.

Figure 21:
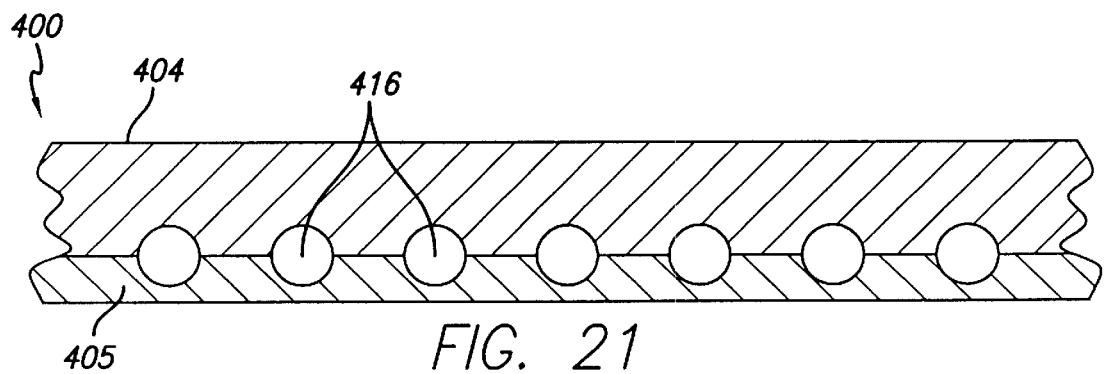
FIG. 21 is a cross-sectional view of another further embodiment of a multi-layer sink in accordance with the present invention.

As further illustrated by way of example in FIG. 21, some chucks do not require cooling channels so that the double wall constructed primary heater 416 may be placed between the top side 404 and the bottom side 405, such that the primary heater 416 may be placed near the top side or the bottom side.

Figure 22:
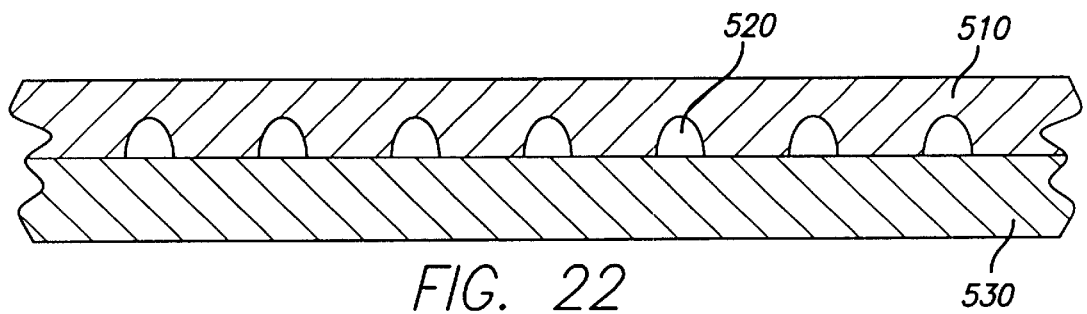
FIG. 22 is a cross-sectional view of another alternative embodiment of a multi-layer sink in accordance with the present invention.

As further illustrated by way of example in FIG. 22, some chucks do not require a heater coil so that the cooling channels may be placed anywhere between the top side 510 and the bottom side 530, such that the cooling channels 520 may be placed near the top side or the bottom side.

With regard to the integrity or strength of the chuck, once the chuck assembly 100 is assembled and brazed together, the resulting chuck has high structural integrity to resist the load and the thermal stresses applied to the chuck. In particular, the pillars 112 formed within the heat sink core 102 are uniformly distributed as illustrated for example in FIG. 7, as previously shown. The uniform distribution of pillars not only heat and cool the chuck more uniformly, but it also distribute the load or stresses uniformly as well. Accordingly, the chuck 100 provides a top surface that is highly resistant to probing forces and deformation. However, such uniform distribution of pillars may be difficult to form within a chuck made by casting. Therefore, by brazing the chuck assembly 100 together uniform distribution of pillars may be formed to improve the strength of the of the chuck.

Furthermore, once the chuck assembly 100 is brazed together, the chuck assembly in essence forms a unitary chuck. By way of background, vacuum brazing is heating the assembly up to a temperature point just below the melting point of the material, in a high vacuum environment, so that the materials in each of the parts will fuse together to form a homogeneous assembly. For instance, for a chuck assembly 100 made of aluminum, once the chuck is heated to a temperature just below the melting point of the aluminum, the pillars 112 would fuse together with the cover plate 114. Similarly, the planer surface of the base layer 118 would fuse together with the cover plate 114. Moreover, the heater 116 is press fitted into the groove 120 of the base layer 118, so that the outer wall 136 of the heater 116 would fuse together with the base layer along the groove 120 to form a unitary chuck assembly 100. With regard to brazing, vacuum brazing may be used, but other methods of fusing materials together known to one ordinarily skilled is within the scope of the present invention.

With regard to the shape of the pillars, beyond the general square shape pillars illustrated in FIG. 7, other shapes are within the scope of the present invention, such as triangular, rectangular, circular, oval, hexagon or the like shapes.

In closing, it is noted that specific illustrative embodiments of the invention have been disclosed hereinabove. However, it is to be understood that the invention is not limited to these specific embodiments. With respect to the claims, it is applicant's intention that the claims not be interpreted in accordance with the sixth paragraph of 35 U.S.C. § 112 unless the term "means" is used followed by a functional statement.

What is claimed is:

1. A low thermal resistance chuck having a side configured to support a device comprising:

a heatsink having a first side and a second side, wherein the first side is closer to the side of the chuck configured to support a device than the second side of the heatsink;

a cooler between the first and second sides of the heatsink; and a primary heater between the first and second sides of the heatsink, wherein the cooler is formed at least as close to the side of the chuck configured to support the device than the primary heater, wherein the heatsink is a multilayer heatsink (MHS) including a core sink, a base sink, and a cover plate between the core sink and the base sink, wherein the core sink has an exposed side defining the first side of the heatsink; and wherein the cooler is a cooling channel formed between the core sink and the cover plate adapted to carry coolant fluid through the heatsink.

2. A chuck according to claim 1, wherein:
the heat sink is a multilayer heat sink (MHS) including a core sink, a base sink, and a cover plate between the core sink and the base sink, wherein the core sink has an exposed side defining the first side of the heat sink; and
the primary heater disposed between the cover plate and the base sink.

3. A chuck according to claim 1, wherein the heat sink further comprises:
the heat sink is a multilayer heat sink (MHS) including a core sink, a base sink, and a cover plate between the core sink and the base sink, wherein the core sink has an exposed side defining the first side of the heat sink; and
the core sink having a plurality of pillars engaged with the cover plate, wherein intermixed with the plurality of pillars is a multiplicity of interconnected channels, the pillars being sized and placed to maximize the cooling surface and uniformly transfer heat from the chuck.

4. A chuck according to claim 1, wherein the heatsink is made of aluminum.

5. A chuck according to claim 1, wherein the primary heater has an outermost wall made of stainless steel.

6. A chuck according to claim 1, wherein the first side of the heatsink has a vacuum groove to form a region of relative low pressure to hold the device.

7. A low thermal resistance chuck having a side configured to support a device comprising:
a heatsink having a first side and a second side, wherein the first side is closer to the side of the chuck configured to support a device than the second side of the heatsink;
a cooler between the first and second sides of the heatsink; and
a primary heater between the first and second sides of the heatsink, wherein the cooler is formed at least as close to the side of the chuck configured to support the device than the primary heater; and
further including a prober adapter, comprising:
an insulator layer;
an adapter heatsink having a secondary heater and a secondary cooler, wherein the insulator layer is coupled between the chuck and the adapter heatsink;
wherein the insulator layer provides a thermal barrier between the chuck and the adapter heatsink, wherein the secondary heater and the secondary cooler are controlled by a controller programmed to maintain the temperature of the prober stage at a predetermined temperature by activating the secondary cooler if the temperature of the chuck is above a predetermined temperature and activating the secondary heater if the temperature of the chuck is below the predetermined temperature.

8. A chuck according to claim 1 adopted to have a low thermal resistance that is shielded from electrical noise from a heater, further comprising:
a chuck having a side adapted to support a device generating heat;
a cooling channel within the chuck; and
a primary heater within the chuck, wherein the cooling channel is at least as close to the side of the chuck adapted to support a device generating heat than the primary heater within the chuck, wherein the primary heater further includes:
a heating coil;
an inner insulation layer surrounding the heater coil; and
an inner wall enclosing the inner insulation layer, wherein the inner wall is grounded; and wherein said chuck includes a bore within said chuck defining an outer wall and insulated from the inner wall, wherein the outer wall is adapted to receive the primary heater.

9. A chuck according to claim 8, wherein:
the chuck has a multilayer sink including:
a core sink having an exposed side being the side of the chuck adapted to support the device;
a base sink; and
a cover plate between the core sink and the base sink;
an opposing side of the exposed side of the core sink having a plurality of pillars engaged with the cover plate;
the outer wall formed within the base sink adapted to receive the primary heater, wherein the plurality of pillars substantially distribute the heat generated from the primary heater uniformly.

10. A chuck according to claim 8, wherein:
the chuck has a multilayer sink including:
a core sink having an exposed side being the side of the chuck adapted to support the device;
a base sink; and
a cover plate between the core sink and the base sink;
an opposing side of the exposed side of the core sink having a plurality of pillars engaged with the cover plate to form cooling channels, wherein cooling fluid flow through the cooling channels to remove heat from the chuck.

11. A chuck according to claim 8, further including:
a prober adapter coupled to the chuck, comprising:
an insulator layer; and
a adapter heatsink having a secondary heater and a secondary cooler, wherein the insulator layer is coupled between the chuck and the adapter heatsink;
wherein the insulator layer provides a thermal barrier between the chuck and the adapter heatsink, wherein the secondary heater and the secondary cooler are controlled by a controller to substantially maintain the temperature near a prober stage at a predetermined temperature.

12. A prober adapter off setting temperature of a chuck to maintain a prober stage at a predetermined temperature, comprising:
an insulator layer;
an adapter heatsink having a secondary heater and a secondary cooler, wherein the insulator layer is coupled between the chuck and the adapter heatsink;
wherein the insulator layer provides a thermal barrier between the chuck and the adapter heatsink, wherein the secondary heater and the secondary cooler are controlled by a controller programmed to maintain the temperature of the prober stage at the predetermined temperature by activating the secondary cooler if the temperature of the chuck is above the predetermined temperature and activating the secondary heater if the temperature of the chuck is below the predetermined temperature.

13. A method of providing an assembled chuck having high resistance to deformation, including the steps of:
providing a heat sink core, the sink core having a coupling side with a plurality of pillars;
providing a base layer, the base layer having a coupling side with a groove;

providing a cover plate;

disposing a heater within the groove of the base layer; and fusing the cover plate between the coupling sides of the heat sink core and the base layer together to form a unitary chuck.

14. A method according to claim 13, wherein the plurality of pillars are uniformly distributed.

15. A method according to claim 13, wherein the pillars are substantially square shapes.

16. A method according to claim 13, wherein the chuck assembly is vacuum brazed to fuse the assembly together to form a unitary chuck.

* * * * *